(12) United States Patent
Rubinsztain et al.

(10) Patent No.: US 10,908,230 B2
(45) Date of Patent: Feb. 2, 2021

(54) RATIOMETRIC SENSOR OUTPUT TOPOLOGY AND METHODS

(71) Applicant: Allegro MicroSystems, LLC, Manchester, NH (US)

(72) Inventors: Ezequiel Rubinsztain, Buenos Aires (AR); Pablo Javier Bolsinger, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/901,103

(22) Filed: Jun. 15, 2020

(65) Prior Publication Data

US 2020/0309866 A1 Oct. 1, 2020

Related U.S. Application Data

(62) Division of application No. 16/040,716, filed on Jul. 20, 2018, now Pat. No. 10,725,122.

(51) Int. Cl.
*G01R 33/00* (2006.01)
*G08B 21/18* (2006.01)
*G01R 33/02* (2006.01)

(52) U.S. Cl.
CPC ......... *G01R 33/0023* (2013.01); *G01R 33/02* (2013.01); *G08B 21/185* (2013.01)

(58) Field of Classification Search
CPC ... G01R 33/0023; G01R 33/02; G08B 21/185
(Continued)

(56) References Cited

U.S. PATENT DOCUMENTS 6,002,338 A 12/1999 Pavlov et al.
6,111,437 A * 8/2000 Patel .................... H03K 5/2481
327/407
(Continued)

FOREIGN PATENT DOCUMENTS

DE 19634714 B4 3/1998
DE 19650935 A1 6/1998
(Continued)

OTHER PUBLICATIONS

Korean Office Action (with Machine English Translation from Espacenet.com) dated Aug. 28, 2020 for Korean Application No. 10-2019-7013456; 15 Pages.
(Continued)

*Primary Examiner* — Nasima Monsur
*Assistant Examiner* — Rahul Maini
(74) *Attorney, Agent, or Firm* — Daly, Crowley, Mofford & Durkee, LLP

(57) ABSTRACT

A sensor includes an output circuit configured to generate a sensor output signal based on an input signal having a logic high or low level, as may be provided by a Schmitt trigger circuit. During normal operation, the output switches between a first percentage of the supply voltage for logic high and a second percentage of the supply voltage for logic low. To convey a failure at the output, an output signal is output as either ground or the supply voltage when a fault is detected. As such, a fault can be communicated any time the output voltage is not equal to the first percentage or the second percentage of the supply voltage.

21 Claims, 13 Drawing Sheets

(58) Field of Classification Search
USPC .......................................................... 324/244
See application file for complete search history.

(56) References Cited

U.S. PATENT DOCUMENTS

| | | | |
|---|---|---|---|
| 6,288,567 | B1 | 9/2001 | Fink |
| 6,542,847 | B1 | 4/2003 | Lohberg et al. |
| 6,687,644 | B1 | 2/2004 | Zinke et al. |
| 6,815,944 | B2 | 11/2004 | Vig et al. |
| 6,968,484 | B2 | 11/2005 | Hummel |
| 7,026,808 | B2 | 4/2006 | Vig et al. |
| 7,319,418 | B2 | 1/2008 | Fink |
| 8,084,969 | B2 * | 12/2011 | David ................... G01D 5/145 318/135 |
| 8,577,634 | B2 | 11/2013 | Donovan et al. |
| 8,624,588 | B2 | 1/2014 | Vig et al. |
| 8,754,640 | B2 | 6/2014 | Vig et al. |
| 8,860,404 | B2 | 10/2014 | Dwyer et al. |
| 8,994,369 | B2 | 3/2015 | Vig et al. |
| 9,068,859 | B2 | 6/2015 | Dwyer et al. |
| 9,151,771 | B2 | 10/2015 | Vig et al. |
| 9,172,565 | B2 | 10/2015 | Cadugan et al. |
| 9,222,990 | B2 | 12/2015 | Dwyer et al. |
| 9,300,235 | B2 | 3/2016 | Ng et al. |
| 9,621,140 | B1 * | 4/2017 | Fernandez ......... G01R 33/0023 |
| 9,634,715 | B2 | 4/2017 | Scheinkerman et al. |
| 9,664,748 | B2 | 5/2017 | Friedrich et al. |
| 9,787,495 | B2 | 10/2017 | Vreeland et al. |
| 10,101,410 | B2 | 10/2018 | Latham et al. |
| 10,216,559 | B2 | 2/2019 | Fernandez |
| 2002/0021144 | A1 | 2/2002 | Morgan et al. |
| 2003/0141862 | A1 | 7/2003 | Vig et al. |
| 2005/0144546 | A1 | 6/2005 | Igeta et al. |
| 2006/0156075 | A1 | 7/2006 | Mitsuishi |
| 2009/0075607 | A1 * | 3/2009 | Khoury ............... H04L 25/0272 455/127.1 |
| 2010/0026279 | A1 | 2/2010 | Vig et al. |
| 2010/0211347 | A1 | 8/2010 | Friedrich et al. |
| 2012/0007680 | A1 | 1/2012 | Hijikata et al. |
| 2013/0335069 | A1 | 12/2013 | Vig et al. |
| 2013/0335074 | A1 | 12/2013 | Dwyer et al. |
| 2014/0208151 | A1 | 7/2014 | Fernandez |
| 2014/0237298 | A1 | 8/2014 | Pe'er |
| 2015/0185279 | A1 | 7/2015 | Milano et al. |
| 2015/0249385 | A1 | 9/2015 | Takahashi |
| 2015/0269018 | A1 | 9/2015 | Ellis |
| 2016/0025820 | A1 | 1/2016 | Scheller et al. |
| 2016/0097692 | A1 | 4/2016 | Hirai et al. |
| 2016/0123780 | A1 | 5/2016 | Snyder et al. |
| 2016/0139230 | A1 | 5/2016 | Petrie et al. |
| 2017/0092024 | A1 | 3/2017 | Slama et al. |
| 2017/0219662 | A1 | 8/2017 | Prentice et al. |
| 2018/0129196 | A1 * | 5/2018 | Hainz ................ G05B 19/0425 |
| 2018/0275823 | A1 * | 9/2018 | Lim .................... G06F 3/0418 |
| 2019/0346294 | A1 * | 11/2019 | Coceani ............ G01D 5/24428 |
| 2020/0025837 | A1 | 1/2020 | Rubinsztain et al. |

FOREIGN PATENT DOCUMENTS

| | | |
|---|---|---|
| DE | 19900774 A1 | 7/2000 |
| EP | 0944888 A2 | 9/1999 |
| WO | WO 9825148 A2 | 6/1998 |
| WO | WO 2010/150416 | 12/2010 |

OTHER PUBLICATIONS

U.S. Appl. No. 62/337,478, filed May 17, 2016, Burdette et al.
U.S. Appl. No. 15/655,377, filed Jul. 20, 2017, Kerdraon et al.
U.S. Appl. No. 15/655,383, filed Jul. 20, 2017, Kerdraon et al.
U.S. Appl. No. 15/655,390, filed Jul. 20, 2017, Pepka et al.
U.S. Appl. No. 15/655,400, filed Jul. 20, 2017, Doogue et al.
U.S. Appl. No. 15/655,403, filed Jul. 20, 2017, Doogue et al.
U.S. Appl. No. 15/982,268, filed May 17, 2018, Lim et al.
Office Action dated Apr. 19, 2018 for U.S. Appl. No. 15/350,400; 18 pages.
Response to Office Action filed on May 9, 2018 2018 for U.S. Appl. No. 15/350,400; 18 pages.
Final Office Action dated Aug. 6, 2018 for U.S. Appl. No. 15/350,400; 24 pages.
Response to Final Office Action filed on Nov. 5, 2018 2018 for U.S. Appl. No. 15/350,400; 18 pages.
PCT International Search Report and Written Opinion dated Mar. 8, 2018 for International Application No. PCT/US2017/059148; 16 pages.
Notice of Allowance dated Nov. 21, 2018 for U.S. Appl. No. 15/350,400; 7 pages.
PCT International Preliminary Report dated May 23, 2019 for Intl. Pat. Appl. No. PCT/US2017/059148; 9 pages.
European 161/162 Communication dated Jun. 6, 2019 for European Application No. 17809079.1; 3 Pages.
Extended Search Report dated Dec. 12, 2019 for European Application No. 19185340.7; 7 pages.
Response to Office Action filed on Dec. 16, 2019 for European Application No. 17809079.1; 28 pages.
Office Action dated Apr. 2, 2020 for U.S. Appl. No. 16/040,716; 20 pages.
Response to Office Action filed on Apr. 23, 2020 for U.S. Appl. No. 16/040,716; 14 pages.
Notice of Allowance dated May 6, 2020 for U.S. Appl. No. 16/040,716; 10 pages.
Response (with Amended Claims & Specification) to European Official Communication dated Jan. 27, 2020 and to Search Opinion dated Dec. 12, 2019 for European Application No. 19185340.7; Response filed Jul. 22, 2020; 24 Pages.
Response (with Machine English Translation from Espacenet.com) to Korean Office Action dated Aug. 28, 2020 for Korean Application No. 10-2019-7013456; Response filed Oct. 28, 2020; 102 Pages.
Korean Office Action (with Machine English Translation from Espacenet.com) dated Nov. 6, 2020 for Korean Application No. 10-2019-7013456; 6 Pages.
Response (with Machine English Translation from Espacenet.com) to Korean Office Action dated Nov. 6, 2020 for Korean Application No. 10-2019-7013456; Response filed Dec. 8, 2020; 22 Pages.

* cited by examiner

RATIOMETRIC SENSOR OUTPUT TOPOLOGY AND METHODS

CROSS REFERENCE TO RELATED APPLICATIONS

This application is a Divisional application and claims the benefit of U.S. patent application Ser. No. 16/040,716, filed on Jul. 20, 2018, which is incorporated herein by reference in its entirety.

STATEMENT REGARDING FEDERALLY SPONSORED RESEARCH

Not Applicable.

FIELD

The present disclosure relates generally to sensor output configurations and more particularly to ratiometric outputs permitting fault indications.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensor integrated circuits are widely used in automobile control systems and other safety critical applications. There are a variety of specifications that set forth requirements related to permissible sensor quality levels, failure rates, and overall functional safety.

SUMMARY

The present disclosure provides ratiometric sensor output configurations that permit failure information to be communicated. The sensor output signal can be provided at different percentages of a supply voltage based on a logic state of an input signal and can be at a level corresponding to the supply voltage or ground when a fault is detected. Some embodiments generate an output signal indicative of a failure of one or more components of the sensor.

According to the disclosure, a circuit to generate an output signal in response to an input signal having a logic high level or a logic low level comprises a resistor divider, an operational amplifier, and a pass element. The resistor divider can be coupled to a supply voltage and configured to produce a first reference voltage that is a first percentage of the supply voltage or a second reference voltage that is a second percentage of the supply voltage not equal to the first percentage of the supply voltage. The operational amplifier can have a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided. The pass element can have a first terminal at which the output signal is provided, a second terminal, and a third, control terminal responsive to the difference signal to generate the output signal at a level corresponding to the first reference voltage or the second reference voltage.

The circuit can include one or more of the following features alone or in combination. The circuit can further include a switch coupled between the second input of the operational amplifier and the resistor divider, the switch configured to couple a first reference resistor of the resistor divider to the second input of the operational amplifier when the input signal is at the logic high level and to couple a second reference resistor of the resistor divider to the second input of the operational amplifier when the input signal is at the logic low level. A fault can be indicated when the output signal is at a level corresponding to the supply voltage or ground. The pass element can comprise an NMOS (n-channel metal-oxide-semiconductor) field-effect transistor. The circuit can further include a chopper circuit coupled to the operational amplifier to remove offset associated with the operational amplifier. The input signal can be provided by a Schmitt trigger circuit. The circuit can form part of a magnetic field sensor and the Schmitt trigger circuit can generate the input signal by comparing a magnetic field signal to a threshold. In an embodiment, the circuit forms part of a magnetic field sensor and wherein the input signal is provided by a linear signal path that generates a magnetic field signal indicative of a magnetic field strength. In some embodiments, the circuit includes a compensation resistor and a compensation capacitor coupled between the output of the operational amplifier and the second input of the operational amplifier. In some embodiments, the circuit comprises an integrated circuit and wherein the output signal is provided at an output terminal of the integrated circuit.

According to a further aspect, a circuit to generate an output signal at an output in response to an input signal having a logic high level or a logic low level includes a first switching element and a second switching element. The first switching element can be configured to be active to couple a first network to the output to provide the output signal at a first percentage of a supply voltage when the input signal is at a logic low level or to be inactive to decouple the first network from the output when the input signal is at a logic high level. The second switching element can be configured to be active to couple a second network to the output to provide the output signal at a second percentage of the supply voltage that is different than the first percentage of the supply voltage when the input signal is at the logic high level or to be inactive to decouple the second network from the output when the input signal is at the logic low level.

The circuit can include one or more of the following features alone or in combination. In an embodiment, the first network comprises at least one first resistor having a first resistance and wherein the second network comprises at least one second resistor having a second resistance different than the first resistance. In an embodiment, the first network comprises at least one first current source configured to source or sink a first current and wherein the second network comprises at least one second current source configured to source or sink a second current, wherein a level of the first current is different than a level of the second current. In an embodiment, the circuit further includes a third switching element coupled in parallel with the first switching element and the second switching element and configured to be active when the neither the first switching element nor the second switching element is active. In an embodiment, each of the first switching element and the second switching element comprises a transistor. In an embodiment, the input signal is provided by a Schmitt trigger circuit, wherein the circuit forms part of a magnetic field sensor and wherein the Schmitt trigger circuit generates the circuit input signal by comparing a magnetic field signal to a threshold. In an embodiment, the input signal is provided by a linear signal path that generates a magnetic field signal indicative of a magnetic field strength. In an embodiment, the circuit comprises an integrated circuit and wherein the output signal is provided to an output terminal of the integrated circuit.

Also described is a method for generating an output signal at an output of a circuit that receives an input signal having a logic high level or a logic low level, including receiving a supply voltage, providing the output signal at a first level corresponding to a first percentage of the supply voltage when the input signal is a logic low level, providing the output signal at a second level corresponding to a second percentage of the supply voltage when the input signal is a logic high level, and providing the output signal at a third level that is different than the first level and the second level when a fault is detected.

The method can include one or more of the following features alone or in combination. In some embodiments, providing the output signal at the first level comprises generating a first difference signal by comparing a feedback version of the output signal to a first reference voltage corresponding to the first percentage and controlling a pass element based on the first difference signal and providing the output signal at the second level comprises generating a second difference signal by comparing the feedback version of the output signal to a second reference voltage corresponding to the second percentage and controlling the pass element based on the second difference signal. In some embodiments, providing the output signal at the first level comprises turning on a first switch coupled to the circuit output through a first network and providing the output signal at the second level comprises turning on a second switch coupled to the circuit output through a second network. In some embodiments, the first network comprises at least one first resistor having a first resistance and the second network comprises at least one second resistor having a second resistance different than the first resistance. In some embodiments, the first network comprises at least one first current source configured to source or sink a first current and the second network comprises at least one second current source configured to source or sink a second current, wherein a level of the first current is different than a level of the second current. In some embodiments, the first percentage comprises a first range and the second percentage comprises a second range non-overlapping with the first range.

BRIEF DESCRIPTION

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

Figure 12:
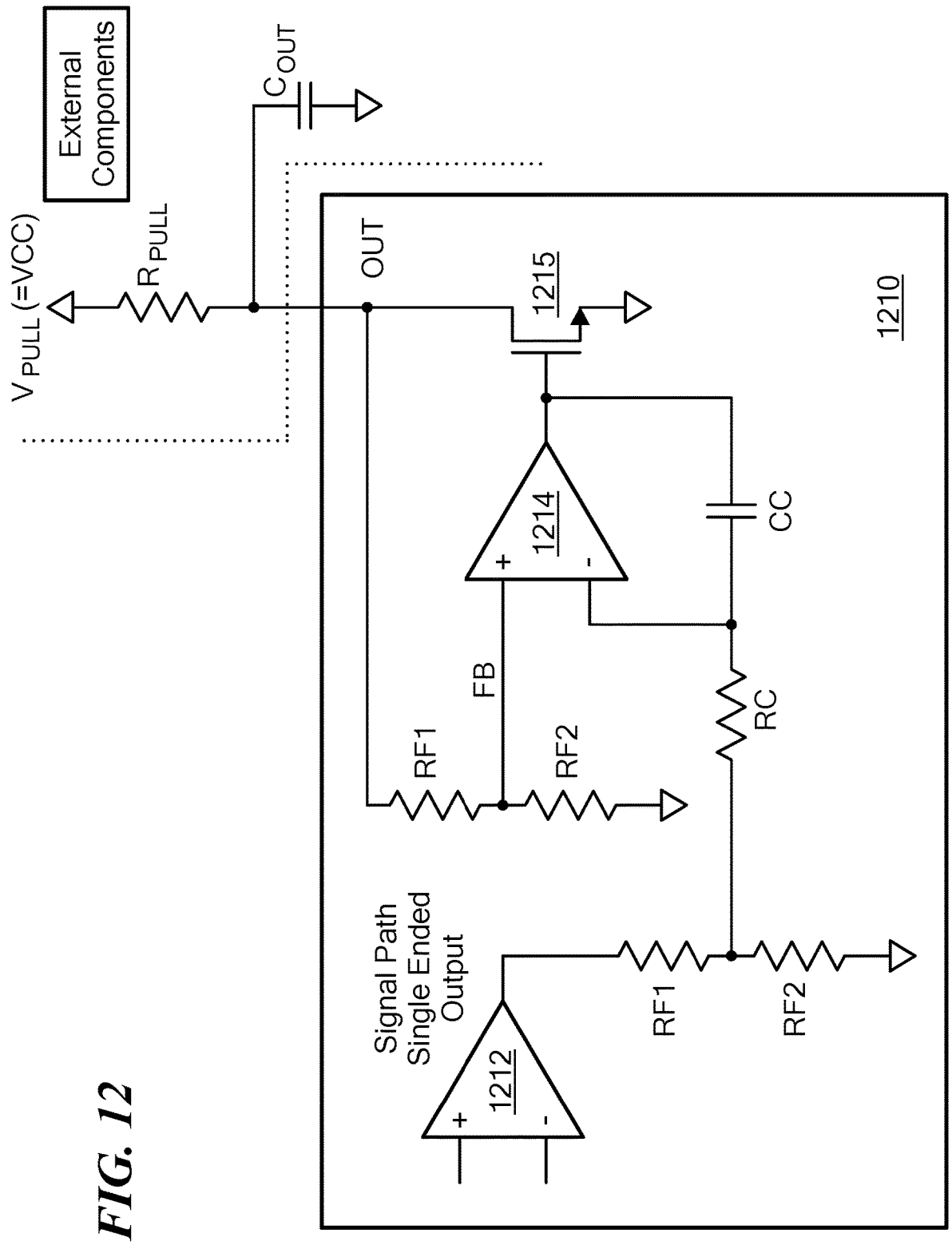
Figure 13:
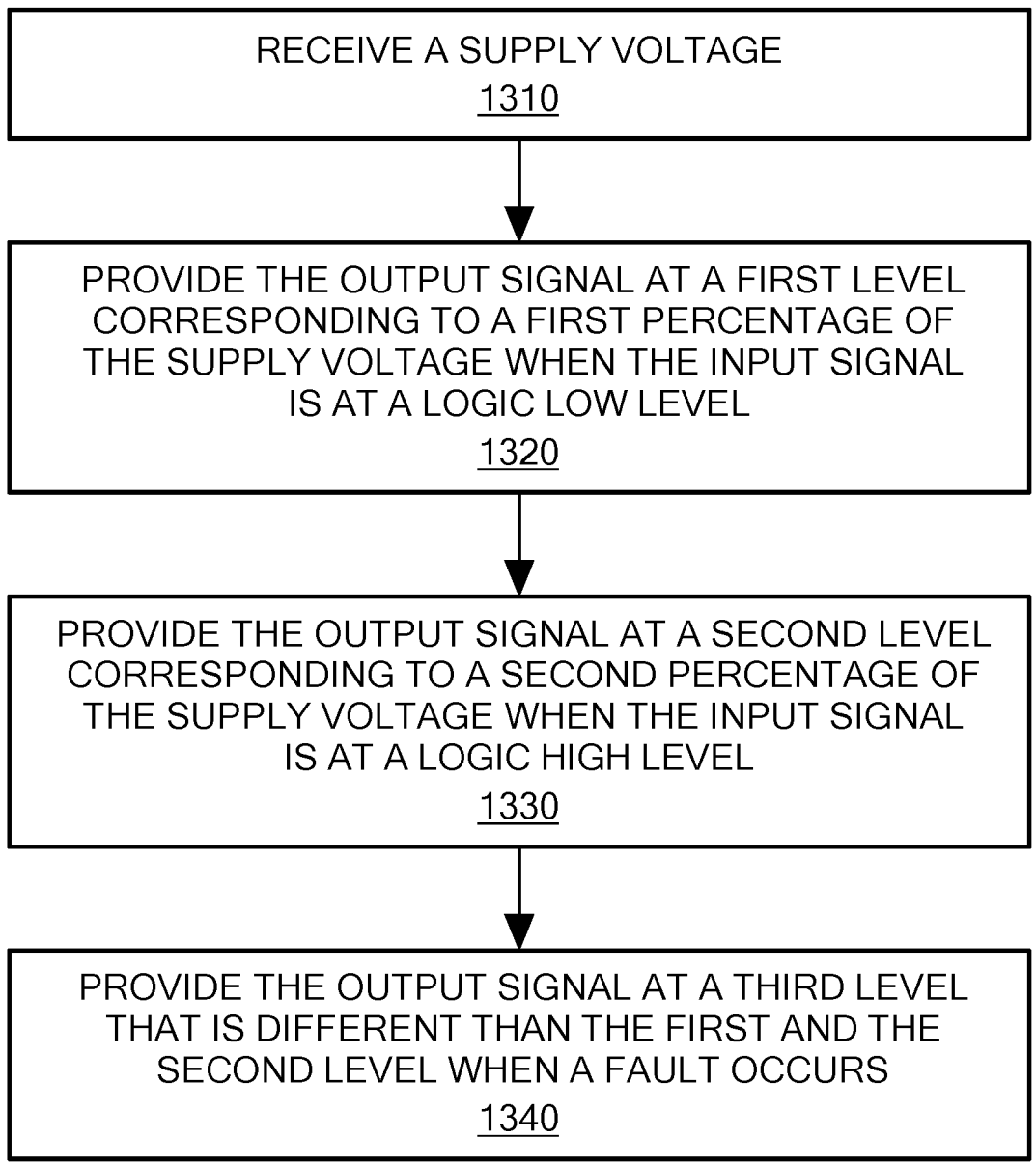

FIG. 12 is a block diagram showing an example configuration of a circuit for generating a sensor output signal for a linear output in a closed-loop feedback configuration, according to an embodiment of the present disclosure; and FIG. 13 is a flow chart illustrating an example process for generating an output signal at an output of a circuit that receives an input signal having a logic high level or a logic low level, applicable to both closed-loop feedback configurations and multiple selectable parallel paths configurations, according to the present disclosure.

DETAILED DESCRIPTION

Figure 1:
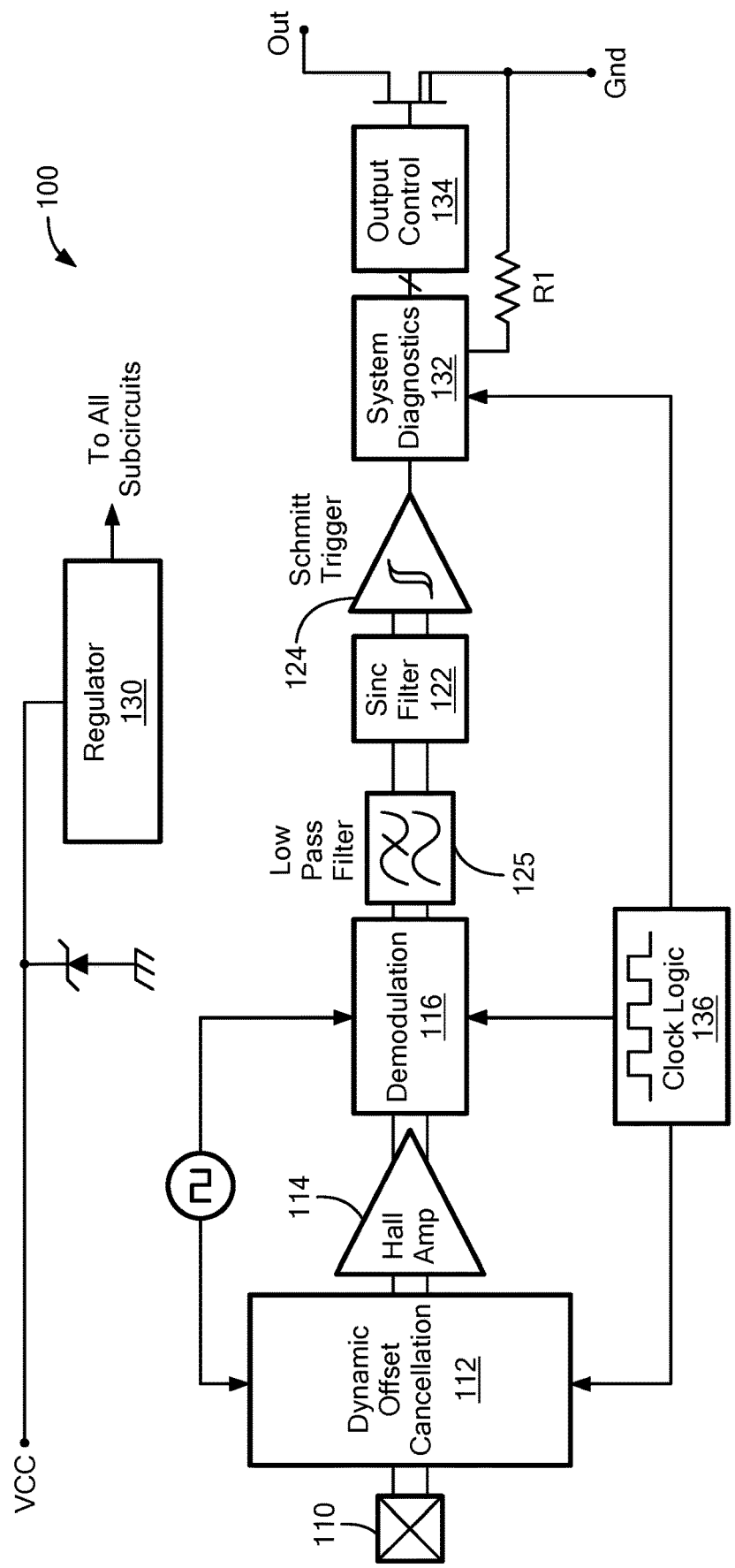
FIG. 1 is a block diagram of a magnetic field sensor, according to the present disclosure.

Referring to FIG. 1, a magnetic field sensor 100 is shown for an example three-wire magnetic switch or latch, according to the present disclosure. As shown, there are three pins for the sensor 100, including a supply voltage (VCC), a ground (Gnd), and the output of the sensor 100 (Out). In a typical magnetic switch or latch, there are two pins that are used for power (VCC and Gnd), and the third pin (Out) provides the output of the sensor 100. The output (Out) generally has two possible values: (a) high or (b) low, to respectively identify two possible magnetic states of the switch or latch, as either: (a) the magnetic field is above operate point specification for the switch/latch or (b) the magnetic field is below the release point of the specification for the switch/latch, respectively. Conventional three-pin configurations use an open-drain configuration for the output, which gives the user the advantages of setting the high voltage level, known as VPULL. In order to limit the current when the output is on, a resistor ($R_{PULL}$, external to the sensor 100, shown in FIG. 2) can be connected between Out and VPULL. The user can also add a capacitor at the output to filter noise, however the external capacitor can limit the output switching speed.

In compliance with certain safety requirements, such as the ASIL (Automotive Safety Integrity Level) requirements, a failure of the sensor is required to be communicated to the user or otherwise output by the sensor 100. However, the open-drain output of conventional three-wire configurations switch between high and low, and do not have a third state that is able to convey the presence of a failure at the output of the sensor. For example, if the output pin is shorted to ground, a conventional open-drain configuration is not able to detect this as a fault, because ground is a normal output state for the sensor. It is desirable to identify such a fault and convey this at the output of a sensor.

Figure 4:
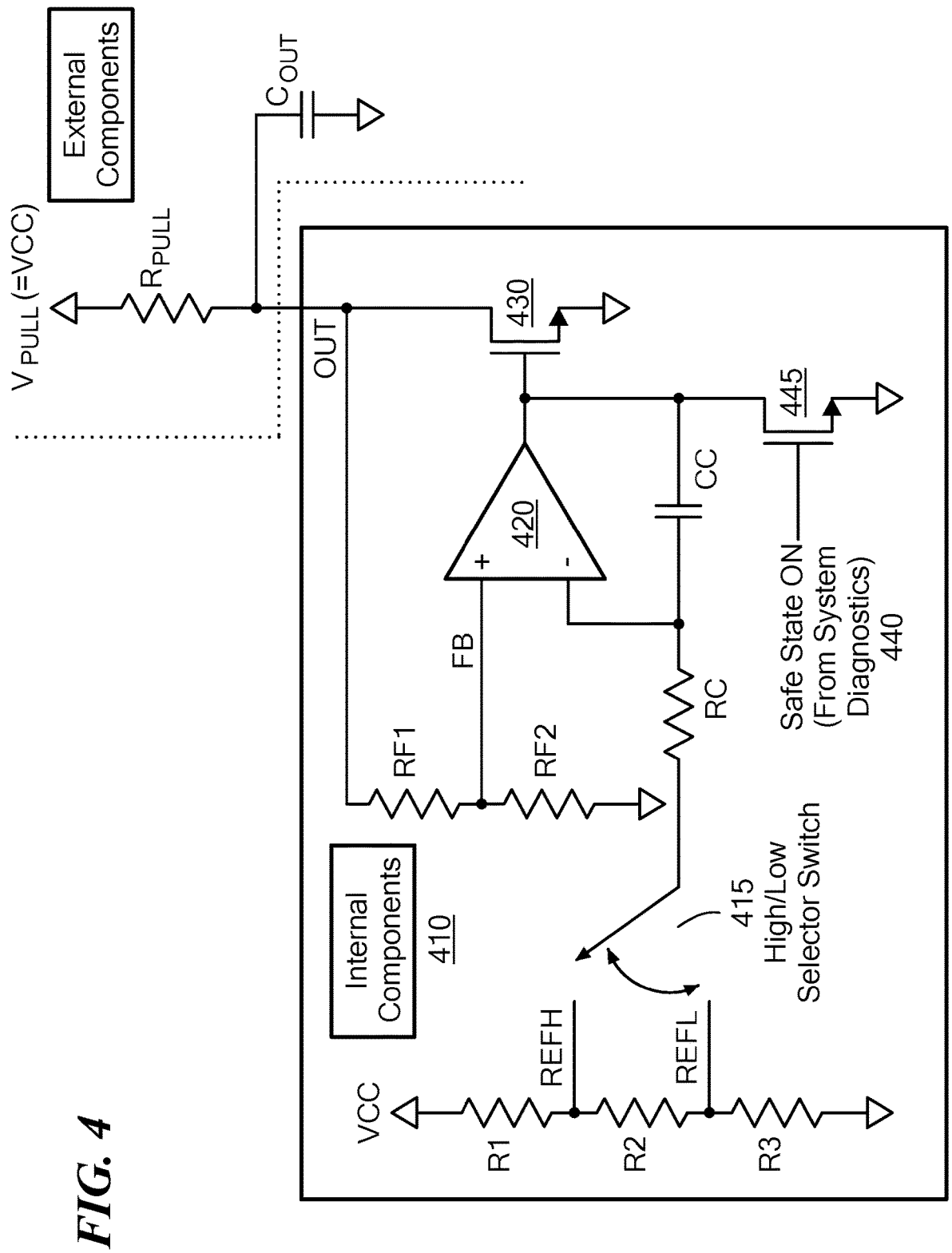
FIG. 4 is a block diagram showing an example configuration of a circuit for generating a sensor output signal including a pass element and an operational amplifier in a closed-loop feedback configuration, according to an embodiment of the present disclosure.
Figure 5:
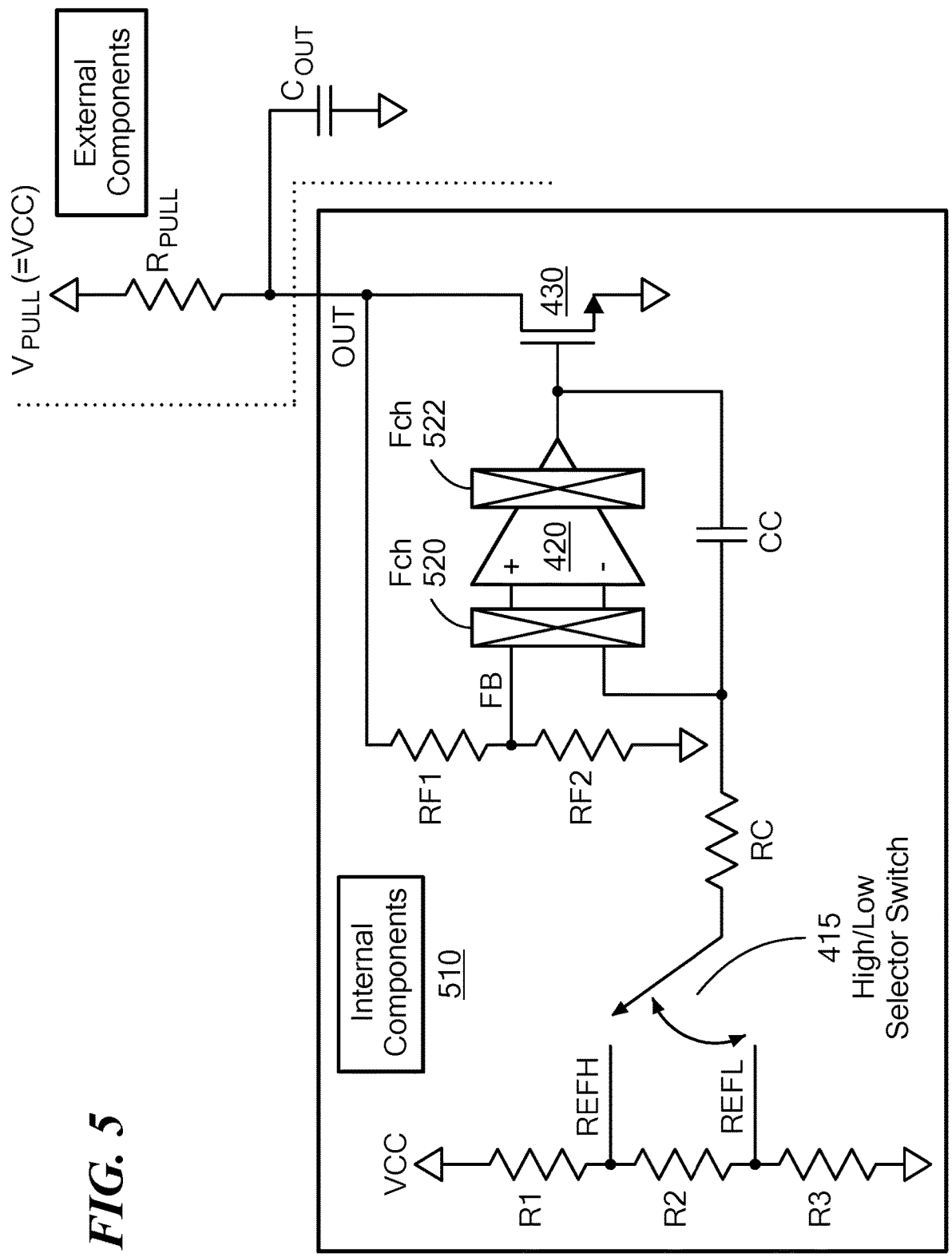
FIG. 5 is a block diagram showing an example configuration of a circuit for generating a sensor output signal including a pass element, and further including a chopping circuit element, according to an embodiment of the present disclosure.

Thus, in accordance with the present disclosure, a ratiometric output configuration is provided (for example, within the output control block 134) that outputs a first percentage (or ratio) of the supply voltage (VCC) to indicate a logic high, and a second percentage (or ratio) of the supply voltage (VCC) to indicate a logic low, thereby allowing VCC or Gnd to be output to indicate a fault. According to the ratiometric output, a logic high state is indicated by outputting a first percentage of the supply voltage (e.g., 70-90%) and a logic low state is indicated by outputting a second percentage of the supply voltage (e.g., 10-30%). This allows the failure state to be conveyed by outputting the supply voltage (VCC) or ground (Gnd). The ratiometric configuration can be a closed-loop feedback arrangement or at least two switchable elements that provide multiple selectable parallel paths. The closed-loop configuration conveys or otherwise informs a safe state by, for example, turning an output pass element (e.g., a NMOS transistor) off to thereby pull the sensor output to VCC or VPULL or on to thereby pull the sensor output to Gnd in order to convey failures. In normal operation, conduction of the pass element can be controlled to regulate the output voltage at the Out pin to provide the output at the first or second percentages. The selectable parallel paths configuration informs a safe state by turning off the two switchable elements, in which case the output control circuit acts as a conventional open-drain configuration and, in normal operation, the parallel paths are selectively controlled to achieve the output at the first or second percentages, as will be appreciated in light of the present disclosure. Refer, for example, to FIGS. 4-5 showing example closed-loop feedback configurations, and to FIGS. 6-7 for example multiple selectable parallel paths configurations.

The magnetic field sensor 100 includes a magnetic field sensing element 110 that generates a magnetic field signal responsive to a magnetic field proximate to the magnetic field sensing element 110. The term "magnetic field sensor" 100 is used to describe a circuit that includes one or more magnetic field sensing elements, generally in combination with other circuits. The magnetic field sensor 100 can be, for example, a rotation detector, a movement detector, a current sensor, or a proximity detector.

Magnetic field sensor 100 can be used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor can be used with a back-bias magnet, and a linear magnetic field sensor that senses a magnetic field density of a magnetic field.

The magnetic field sensing element 110 can be, but is not limited to, a Hall effect element, a magnetoresistance element, or a magnetotransistor and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The magnetic field signal generated by the magnetic field sensing element 110 is input to a dynamic offset cancellation circuit 112, which is output to an amplifier 114. The amplifier 114 can be a Hall amplifier, for example. The amplifier 114 is coupled to receive the magnetic field signal from the magnetic field sensing element 110 and generate an amplified signal for coupling a demodulation block 116, a low-pass filter 125, and a sinc filter 122. Dynamic offset cancellation circuit 112 may take various forms including chopping circuitry and may function in conjunction with demodulation block 116 to remove offset that can be associated with the magnetic field sensing element 110 and/or the amplifier 114 under the control of signals from clock logic 136. For example, offset cancellation circuit 112 can include switches configurable to drive the magnetic field sensing element (e.g., Hall plate) in two or more different directions such that selected drive and signal contact pairs are interchanged during each phase of the chopping clock signal and offset voltages of the different driving arrangements tend to cancel. The low-pass filter circuit 125 can be designed to remove undesirable spectral components in the resulting signal to generate a filtered signal for coupling to the sinc filter 122. The filter 122 functions to average two or more samples of the magnetic field signal in order to remove any of the filtered Hall Plate offset and front-end amplifier offset, which are at the chopping frequency.

A Schmitt trigger 124 is configured to compare the output of the sinc filter 122 to a reference voltage, or threshold to produce logic high and low values.

The output of the Schmitt trigger 124 is coupled to a system diagnostics controller, or processor 132 that is configured to generate (through output control 134) an output signal of the sensor 100 at output pin Out. As described herein, a conventional three-wire open-drain output configuration that provides a single path for a voltage signal has one of two values (high or low), as shown below in Table 1. The ratiometric configuration of the present disclosure (closed-loop feedback configuration or multiple selectable parallel path configuration) allows for the logic high level and the logic low level to be represented as, respectively, X % and Y % of the supply voltage, and the safe state can thus be conveyed as either the supply voltage itself or Gnd as is also shown in Table 1. It will be appreciated that "X" and "Y" are variables indicative of a percentage of the supply voltage and can be any number between 0 and 100.

TABLE 1

|  | Standard Output Voltage | New Output Voltage |
| --- | --- | --- |
| High State | VPULL | X % of VPULL |
| Low State | <Vsat | Y % of VPULL |
| Safe State | — | VPULL or GND |

The system diagnostics 132 receives the output of the Schmitt trigger circuit 124 and can be configured to perform various diagnostics to detect faults. Accordingly, the output of the system diagnostics 132, and thus the input signal to the output control block 134, can include the output of the Schmitt trigger that can be a logic high or a logic low and can also include a fault signal to indicate a fault.

As used herein the term "supply voltage" (of which the ratiometric output one of two percentages X % or Y %) refers generally to pull up voltage VPULL. Although a user generally has the flexibility to set the pull up voltage VPULL to the same voltage as the supply voltage level VCC or to a different voltage level, in the feedback configuration embodiments described herein, the VPULL voltage must be set to the supply voltage level VCC in order to achieve output levels ratiometric with VPULL.

In accordance with the ratiometric configuration of the present disclosure, rather than providing either a high or low output, two different percentages (or two different ranges of percentages) of VCC or VPULL can be used to represent the logic high and logic low values, so that VCC, VPULL, or GND can be output to indicate a fault. The output of the Schmitt trigger circuit 124 controls the switch element(s) of the output control circuit 134 to provide the X %, Y %, and GND, as will be apparent in light of the present disclosure. The output signal is provided as X % or Y %, and in some embodiments is driven to something other than X % or Y % (e.g., VCC or GND) to indicate a fault.

Table 2 below illustrates the output relative to the fault condition for the various output states and output levels used to indicate a fault, according to an example embodiment. The output state corresponds to the Schmitt output (e.g., the output of Schmitt trigger 124 shown in FIG. 1) and the output level corresponds to the output of the output control circuit 134 at the sensor output pin (e.g., Out shown in FIG. 1 and/or VOUT shown in FIG. 2). As shown in Table 2, when there is no fault, the output state (e.g., Schmitt trigger 124) switches between $V_{OUT(LOW)}$ and $V_{OUT(HIGH)}$ and the corresponding output level (e.g., of the output control circuit 134) is, respectively, 20% or 80% of VPULL (or $V_{PU}$). This allows various other faults to be conveyed at the output of the sensor. A short-circuit fault of VCC-VOUT is not capable of conveying this output state during normal switching at the Schmitt trigger output, however it can be conveyed as VCC output level. A short-circuit fault VOUT-GND likewise is not capable of conveying this output state during normal switching at the Schmitt trigger output, however it can be conveyed as GND at the output level. A short-circuit fault of VCC-GND is also not capable of conveying this output state during normal switching at the Schmitt trigger output, however it can be conveyed as VCC at the output level. An open-circuit fault at VCC is not capable of conveying this output state during normal switching at the Schmitt trigger output, however it can be conveyed as VPU at the output level. An open-circuit fault at VOUT corresponds to normal switching between $V_{OUT(LOW)}$ and $V_{OUT(HIGH)}$ and the corresponding output level conveyed to the sensor is VPU. An open-circuit fault at GND does not have a corresponding output state at the Schmitt trigger output, however the output level is VPU as shown in Table 2. An internal fault results in an output state of $V_{OUT(FAULT)}$, which can correspond to VPU for the output level of the output control circuit. Accordingly, the various fault conditions can be conveyed at the sensor output, while allowing normal switching when no fault is detected.

TABLE 2

Fault Conditions and Resulting Output Level.

| Fault | Output State | Output Level |
| --- | --- | --- |
| No Fault | Normal Switching between $V_{OUT(LOW)}$ and $V_{OUT(HIGH)}$ | 20% or 80% of $V_{PU}$, respectively |
| Short, VCC-VOUT | n/a | $V_{CC}$ |
| Short, VOUT-GND | n/a | GND |
| Short, VCC-GND | n/a | $V_{CC}$ |
| Open, VCC | n/a | $V_{PU}$ |
| Open, VOUT | Normal Switching between $V_{OUT(LOW)}$ and $V_{OUT(HIGH)}$ | $V_{PU}$ |
| Open, GND | n/a | $V_{PU}$ |
| Internal Fault | $V_{OUT(FAULT)}$ | $V_{PU}$ |

Note:
$V_{OUT(FAULT)} = V_{PULL-UP}$ and $V_{PULL-UP} = V_{CC}$

Functionality of the controller 134 will be described further below. As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module. A regulator 130 is coupled between supply voltage VCC and ground and to the various components and sub-circuits of the sensor 100 to regulate the voltage supplied thereto.

Figure 2A:
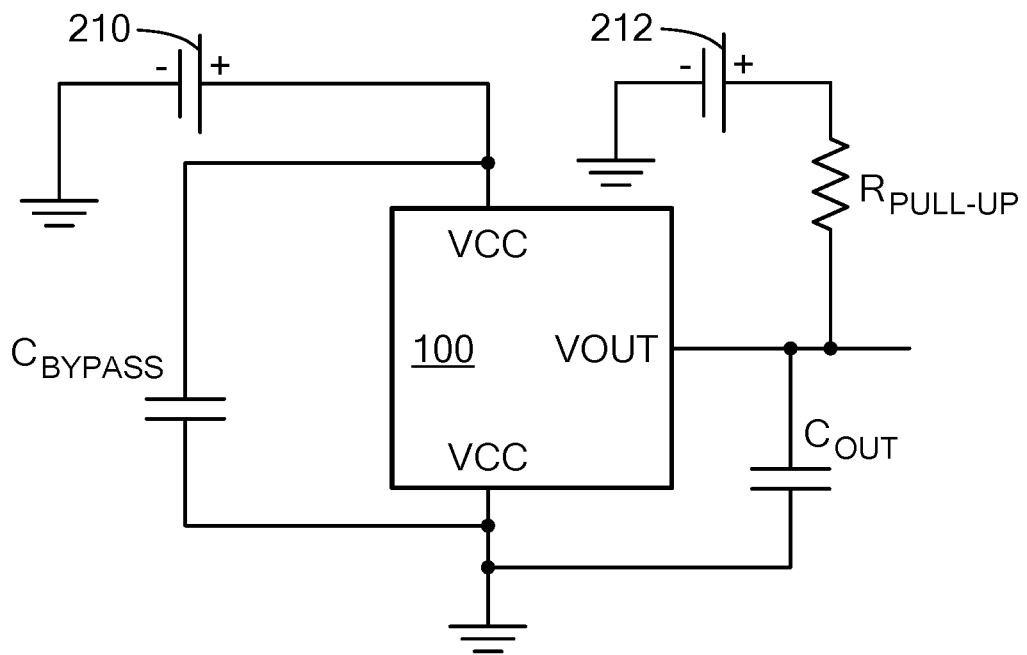
FIG. 2A is a block diagram showing an example three-pin configuration for a sensor according to the present disclosure.
Figure 2B:
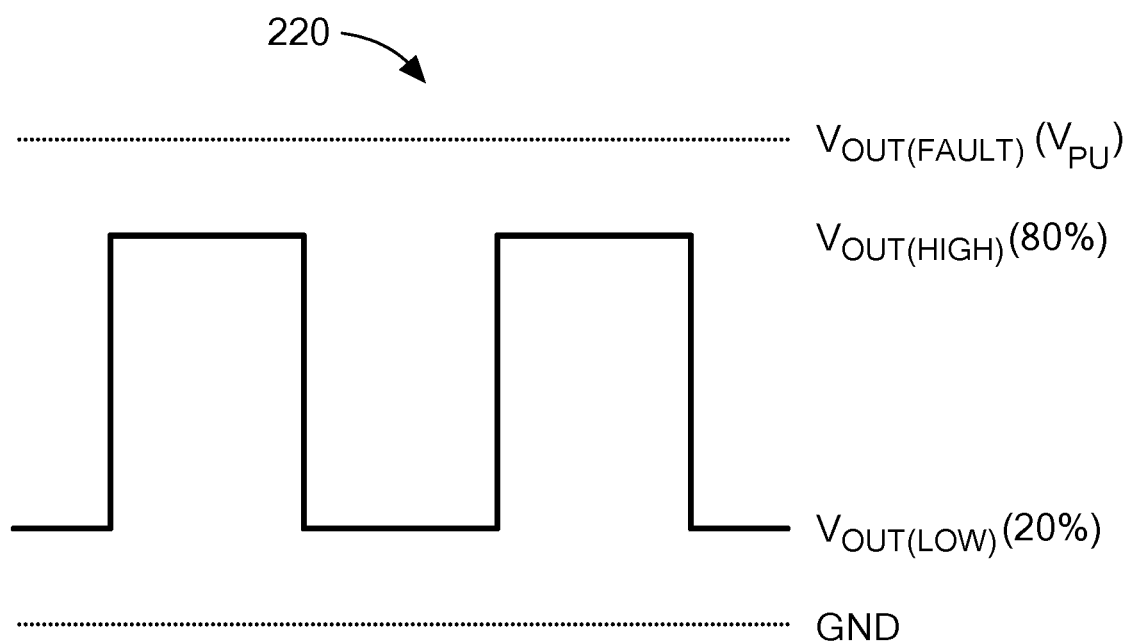
FIG. 2B is a graphical diagram showing an output of a sensor, according to an embodiment of the present disclosure.

FIG. 2A is a block diagram showing an example three-pin configuration for sensor 100, according to embodiments of the present disclosure. The example three-pin configuration includes the supply voltage (VCC), the output (VOUT), and ground (GND). In accordance with the present disclosure, the output VOUT is regulated by an output control circuit to output a first percentage (X %) in response to a logic high value and to a second percentage (Y %) in response to a logic low value. FIG. 2B is a graphical diagram showing an example ratiometric output of the sensor, according to the present disclosure. As shown, in graph 220, during normal operation the output switches between $V_{OUT(HIGH)}$ (X % of the supply voltage) and $V_{OUT(LOW)}$ (Y % of the supply voltage). The output can be provided at a different level such as $V_{OUT(FAULT)}$ or GND when a fault occurs. It will be appreciated that the voltage level of VCC 210 and the pull up voltage VPULL 212 may or may not be the same, although VPULL and VCC must be the same in the feedback configuration embodiments described below.

Figure 3:
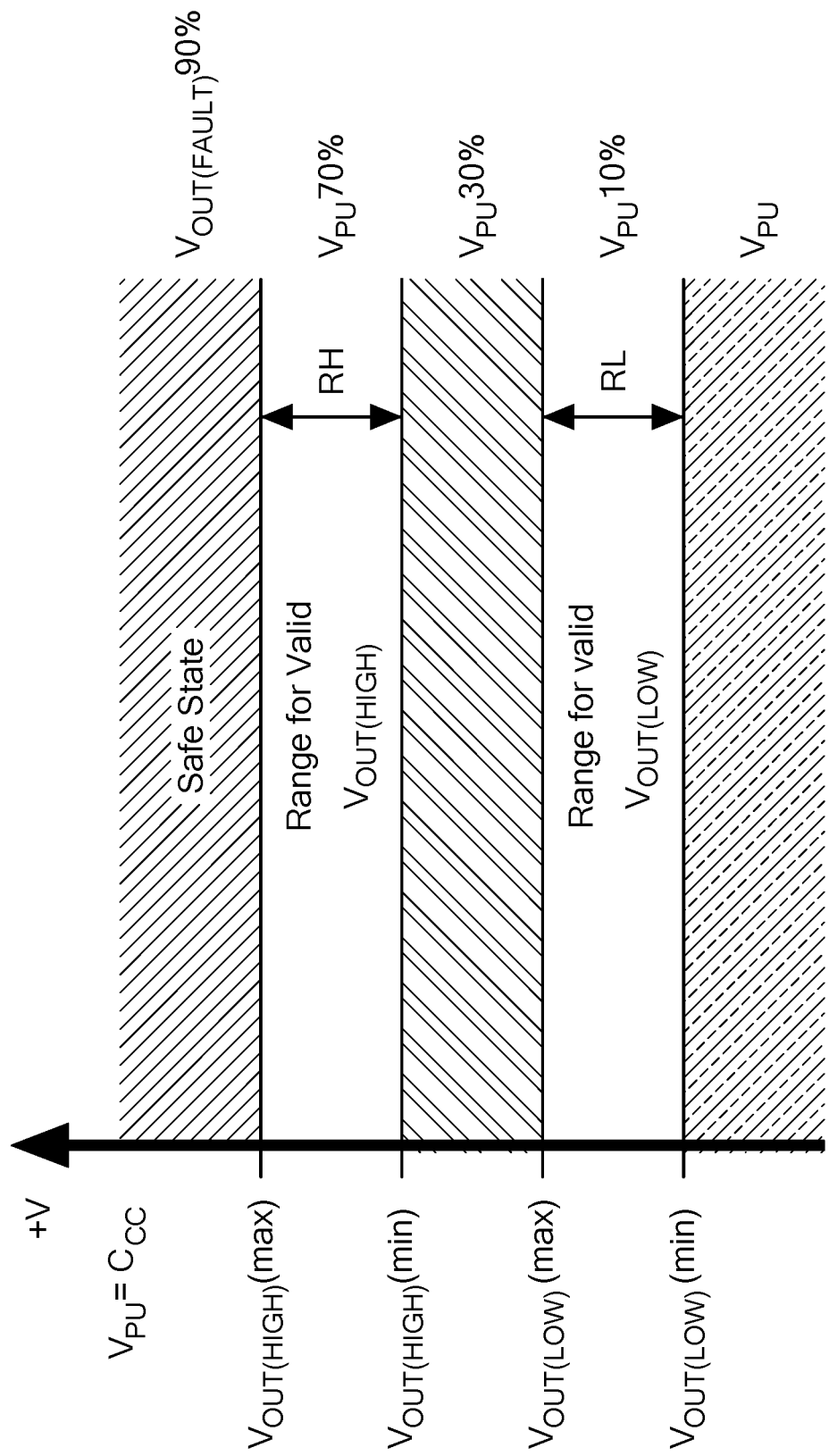
FIG. 3 is a graphical diagram showing $V_{OUT(HIGH)}$, $V_{OUT(LOW)}$, and $V_{OUT(FAULT)}$ values for a sensor, according to an embodiment of the present disclosure.

FIG. 3 is a graphical diagram showing $V_{OUT(HIGH)}$, $V_{OUT(LOW)}$, and $V_{OUT(FAULT)}$ values according to an embodiment of the present disclosure, in which X % and Y % can be expressed as a range, for example 70-90% for high and 10-30% for low. As such, any output that does not fall within the high range or the low range can be considered a fault. As shown, the range for $V_{OUT(HIGH)}$ is 70-90% of the supply voltage and the range for $V_{OUT(LOW)}$ is 10-30% of the supply voltage. Thus, an output that is 70-90% of VPULL indicates a logic high value, and an output that is 10-30% of VPULL indicates a logic low value. It is possible to convey a fault by outputting any voltage that does not fall within one of the ranges for a logic high or for a logic low. In some embodiments, a specific fault can be indicated by driving the output to either $V_{CC}$ or GND. It should be apparent that the ranges of 10-30% for the low value and 70-90% for the high value are only example numbers, and any value could be used having any range, so long as the ranges are not overlapping in order to thereby permit a logic high condition to be distinguished from a logic low condition. For example, the low value could be 15-40% and the high value could be 60-95%, so long as one range is provided for the low value and another range is provided for the high value, and they do not overlap with each other.

Figure 6:
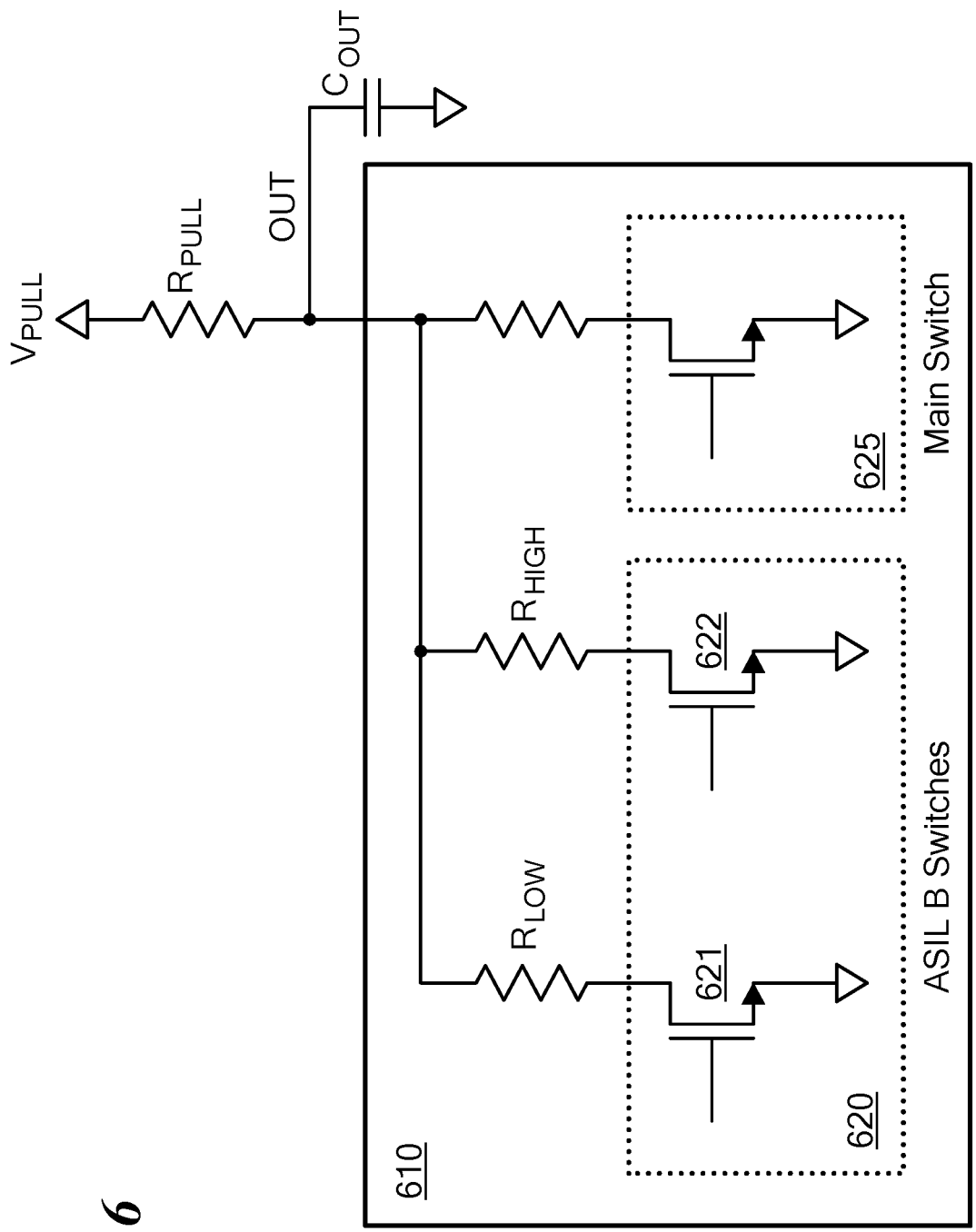
FIG. 6 is a block diagram showing an example configuration of a circuit for generating a sensor output signal, having at least two switching elements to provide multiple selectable parallel paths, according to an embodiment of the present disclosure.

Refer to FIG. 4 for an example configuration of a closed-loop feedback system to provide an output at X %, Y %, and VCC/GND in accordance with an embodiment of the present disclosure. Refer to FIG. 6, for example, for another configuration that provides selectable parallel paths rather than the closed-loop feedback configuration to provide X %, Y %, and VCC or GND, in accordance with an embodiment of the present disclosure. It will be appreciated that any configuration shown herein, or an equivalent thereof, can be used to provide the output having X % for a logic high level and Y % for a logic low level.

FIG. 4 is a block diagram showing an example ratiometric configuration of a sensor output circuit in greater detail including a pass element and an operational amplifier in a closed-loop feedback configuration, according to an embodiment of the present disclosure. FIG. 4 shows an example sensor output circuit 410 which, for example, can reside within the output control block 134 shown in FIG. 1. Also shown in FIG. 4 are components external to the sensor including pull-up resistor RPULL and filter capacitor COUT. The circuit 410 has a closed-loop configuration and includes a resistor divider comprising resistors RF1 and RF2 that sense the output voltage on the OUT pin. The output is fed back into one input of the operational amplifier 420 to provide a feedback signal FB. The feedback signal FB is compared to a reference voltage (fed into the other input of the operational amplifier 420) that is taken from VCC, in which two possible references can be selected.

The reference voltage is generated by a resistor divider (including resistors R1, R2, and R3) coupled to supply voltage VCC and selectively coupled to the operational amplifier 420 by a switch 415. A first reference voltage REFH is selected by the switch 415 to set the high state, which can be X % of the supply voltage (VPULL), and a second reference voltage REFL is selected by the switch 415 to set the low state, which can be Y % of the supply voltage (VPULL) as shown in Table 1 above. The switch 415 can be controlled by the signal output by the Schmitt trigger (e.g., Schmitt trigger 124 in FIG. 1). When the output of the Schmitt trigger (i.e., the input signal to the output control block 134) is a logic high, the switch selects the high reference voltage REFH, and when the input signal is a logic low, the switch selects the low reference voltage REFL.

The comparison of the feedback signal (FB) to the high reference voltage REFH or the low reference voltage REFL is performed by the operational amplifier 420. The resulting difference signal generated by the operational amplifier 420 controls conduction of the pass element 430 (e.g., NMOS transistor) to output the selected percentage of the supply voltage.

In embodiments, a switch 445 as may take the form of a field-effect-transistor (FET) can be coupled to the gate of pass element 430 to turn the pass element 430 off when a fault is detected (e.g., by diagnostics controller 132). In particular, when a fault is detected, switch 445 can be turned on to thereby pull the gate of pass element 430 low, and turn off pass element 430 to allow the output circuit 410 to act as a conventional open-drain configuration to convey a safe state or fault by pulling the output to VPULL or VCC through RPULL. Whereas, when no fault is detected, switch 445 can be off and thereby not interfere with the ratiometric control of pass element 430 by operational amplifier 320. It will be appreciated that by design of the signal level of fault signal 440 and device type of switch 445, when a fault is detected, switch 445 may alternatively cause pass element 430 to turn on and thereby pull the sensor output to GND to thereby indicate the fault.

In order to stabilize the feedback system, compensation components as may include a compensation resistor (RC) and a compensation capacitor (CC) can be provided. These compensation components add a pole at the 0 Hz (integrator) and a zero at $1/(2\pi*RC*CC)$. The compensation resistor (RC) must be significantly greater than the sum of R2 and R3 (RC>>R2+R3). The compensation components have high open-loop gain at low frequencies to reduce the regulation error, and at high frequencies the open-loop gain drops until the zero comes in, leaving the output pole to continue the gain dropping until the 0 dB line is crossed. If the output pole is equal to or greater than zero, the phase margin is sufficient to have the systems table. If no external capacitor COUT is used, the pole at the NMOS gate limits the bandwidth before another internal pole comes in. As such, there is no requirement for an external capacitor (COUT) that is typically required with an open-loop configuration. By stabilizing internally, the external capacitor COUT is not needed. The configuration also allows for a conventional open drain output to be realized by turning off the pass element 430, thereby allowing both types of outputs on a single die.

FIG. 5 is a block diagram showing an example configuration of a sensor output circuit in greater detail including a pass element, and further including chopping circuitry, according to an embodiment of the present disclosure. The output circuit 510 of FIG. 5 includes the same components having like reference numerals as FIG. 4, and also chopping circuitry. The error associated with regulating conduction of the pass element 430 depends on the offset of the operational amplifier 420 and mismatches of the resistor dividers. One way to eliminate the offset of the operational amplifier 420 is by adding chopper circuitry 520 and demodulator 522 to move the offset of the operational amplifier to higher frequencies. A chopper circuit is used to break up the input signal so that it can be processed as if it were an AC signal, and then integrated back to a DC signal at the output. If the chopper frequency is higher than the bandwidth of the closed-loop configuration, the offset will be filtered.

FIG. 6 is a block diagram showing an example configuration of a circuit for generating a sensor output signal, having at least two switching elements to provide selectable parallel paths, according to an embodiment of the present disclosure. The output circuit 610 includes at least two switching elements 620 including a first switching element 621 and a second switching element 622 that are each, respectively, coupled to a resistor RLOW or resistor RHIGH to generate the two respective output voltages as respective percentages of the supply voltage. The first switching element 621 is configured to be active to couple a first network (e.g., pull-down resistor RLOW) to the output to provide the output signal at a first percentage of a supply voltage when the input signal is a logic low level or to be inactive to decouple the first network from the output when the input signal is at a logic high level. The second switching element 622 is configured to be active to couple a second network (e.g., pull-down resistor RHIGH) to the output to provide the output signal at a second percentage of the supply voltage that is different than the first percentage of the supply voltage when the input signal is at the logic high level or to be inactive to decouple the second network from the output when the input signal is at the logic low level. In the embodiment shown in FIG. 6, the first network comprises a first resistor having a first resistance and the second network comprises a second resistor having a second resistance different than the first resistance. In other embodiments, the first network can comprise a first current source and the second network can comprise a second current source. Also shown in FIG. 6 are components external to the sensor including pull-up resistor RPULL and filter capacitor COUT.

The circuit 610 includes a third switching element 625 that is coupled in parallel with the first switching element 621 and the second switching element 622 and configured to be active when neither the first switching element nor the second switching element is active. Accordingly, both of the switching elements 621 and 622 can be turned off and by operation of switch 625 the sensor output can be provided as a conventional open-drain output. One of the three switching elements 621, 622, and 625 are configured to be active at a time, each one corresponding to, for example, a different line of the Table 1 shown hereinabove. Each of the first, second, and third switching elements can comprise a transistor or other appropriate switching element.

It will be appreciated that the embodiment of FIG. 6 requires that RPULL be known since RPULL forms a resistor divider with RLOW to establish the first percentage of the supply voltage and forms a resistor divider with RHIGH to establish the second percentage of the supply voltage. However, by providing a resistor array as disclosed in FIG. 7, this allows the end user (e.g., customer) to have a different (unknown) value for RPULL since trimming is provided.

Figure 7:
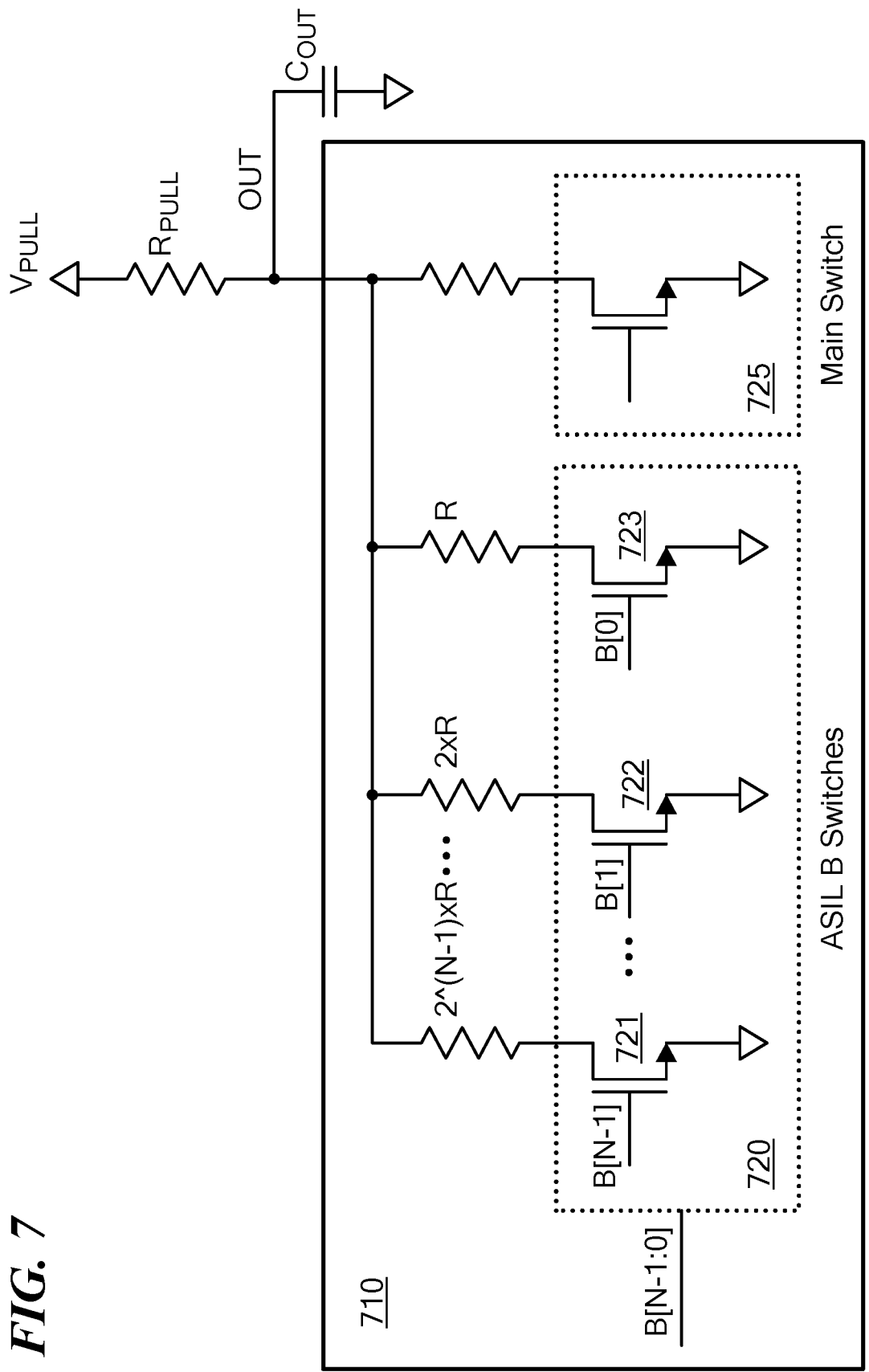
FIG. 7 is a block diagram showing an example configuration of a circuit for generating a sensor output signal, having at least two switching elements to provide multiple selectable parallel paths, and further including a resistor array coupled to some of the switching elements, according to an embodiment of the present disclosure.

FIG. 7 is a block diagram showing an example configuration of a circuit for generating a sensor output signal, having at least two switching elements to provide multiple selectable parallel paths similar to FIG. 6, and further including a resistor coupled to some of the switching elements to provide trimming, according to an embodiment of the present disclosure. The output circuit 710 includes an array of switching elements 720 including at least three switching elements 721, 722, and 723, that are each, respectively, coupled to one of scaled resistors $2^{(N-1)} \times R$, $2 \times R$, and R, to generate at least two respective output voltages as respective percentages of the supply voltage. By providing an input select signal B[N−1:0], each of the switches 721, 722, 723, can be selectively turned off or on to provide the desired output voltage at a level established by a resistor divider thus formed by RPULL and the selected one (or ones) or resistors R, $2 \times R$, $2^{(N-1)} \times R$. With this particular configuration, the first and second percentages of the supply voltage presented at the sensor output can be adjusted or trimmed based on the value of RPULL and the desired first and second percentages. The input select signals or bits B[N−1:0] can be stored, for example, in an EEPROM, in the form of different codes to generate the high and low outputs at the percentages desired. Also shown in FIG. 7 are components external to the sensor including pull-up resistor RPULL and filter capacitor COUT.

The circuit 710 includes an additional switching element 725 that is coupled in parallel with the array of switching elements 720 and is configured to be active when none of the switches 721, 722, or 723 in the array of switching elements 720 are active. Accordingly, all of the switching elements in the switching array 720 can be turned off and by operation of the switch 725 the sensor output can be provided as a conventional open-drain output. Each of the switching elements can comprise a transistor or other appropriate pass element or switching element.

According to the embodiments of FIGS. 6 and 7, the output signal is provided at the first level by turning on one or more first switches coupled to the circuit output through one or more first networks and at the second level by turning on one or more second switches coupled to the circuit output through one or more second networks. The first network can be a first resistor having a first resistance and the second network can be a second resistor having a second resistance different than the first resistance. In some embodiments, the first network can comprise a first current source and the second network can comprise a second current source, as shown in FIGS. 8 and 9.

Figure 8:
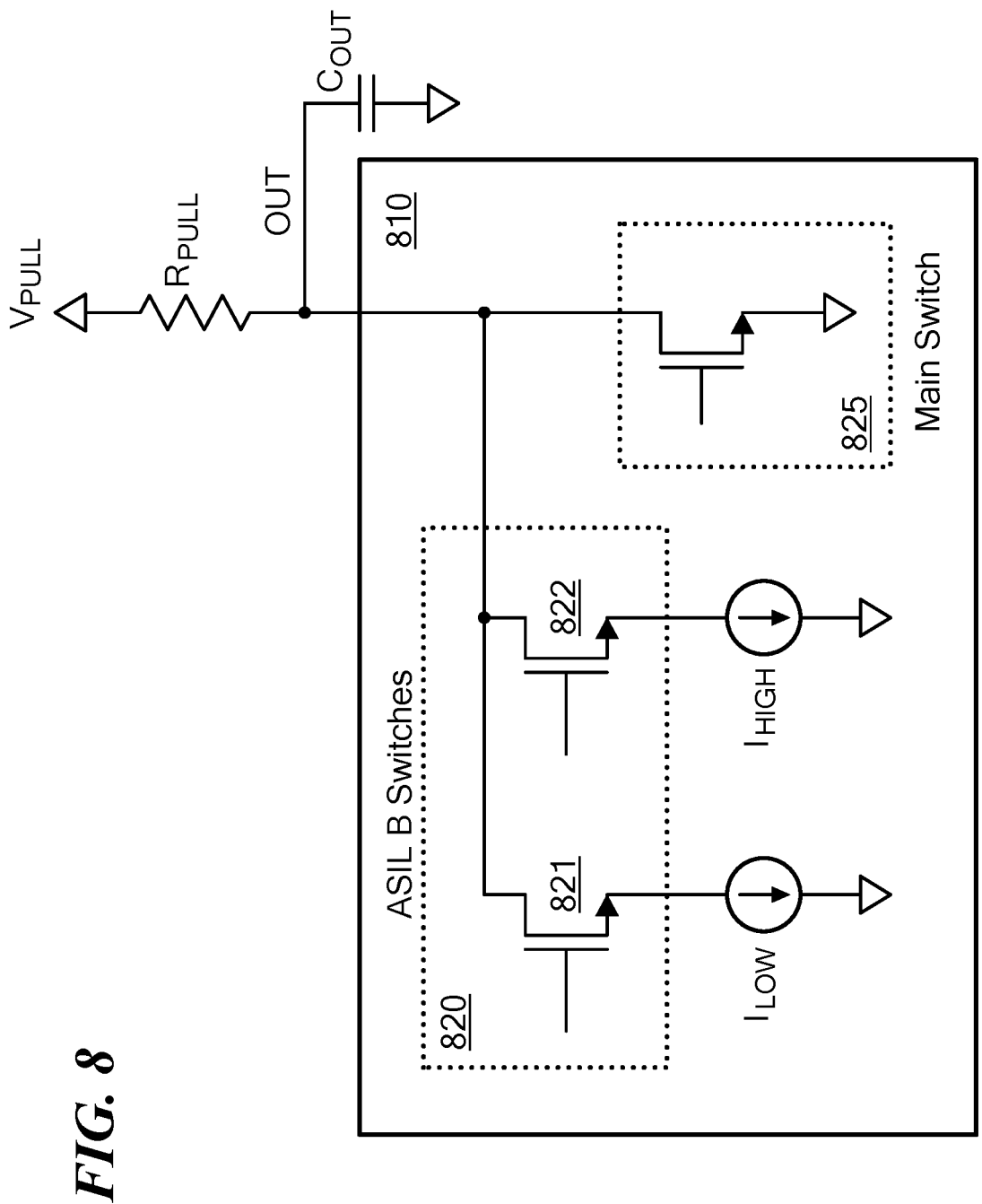
FIG. 8 is a block diagram showing an example configuration of a circuit for generating a sensor output signal having switching elements and a current source to generate two different percentage voltages with a configuration having multiple selectable parallel paths, according to an embodiment of the present disclosure.
Figure 9:
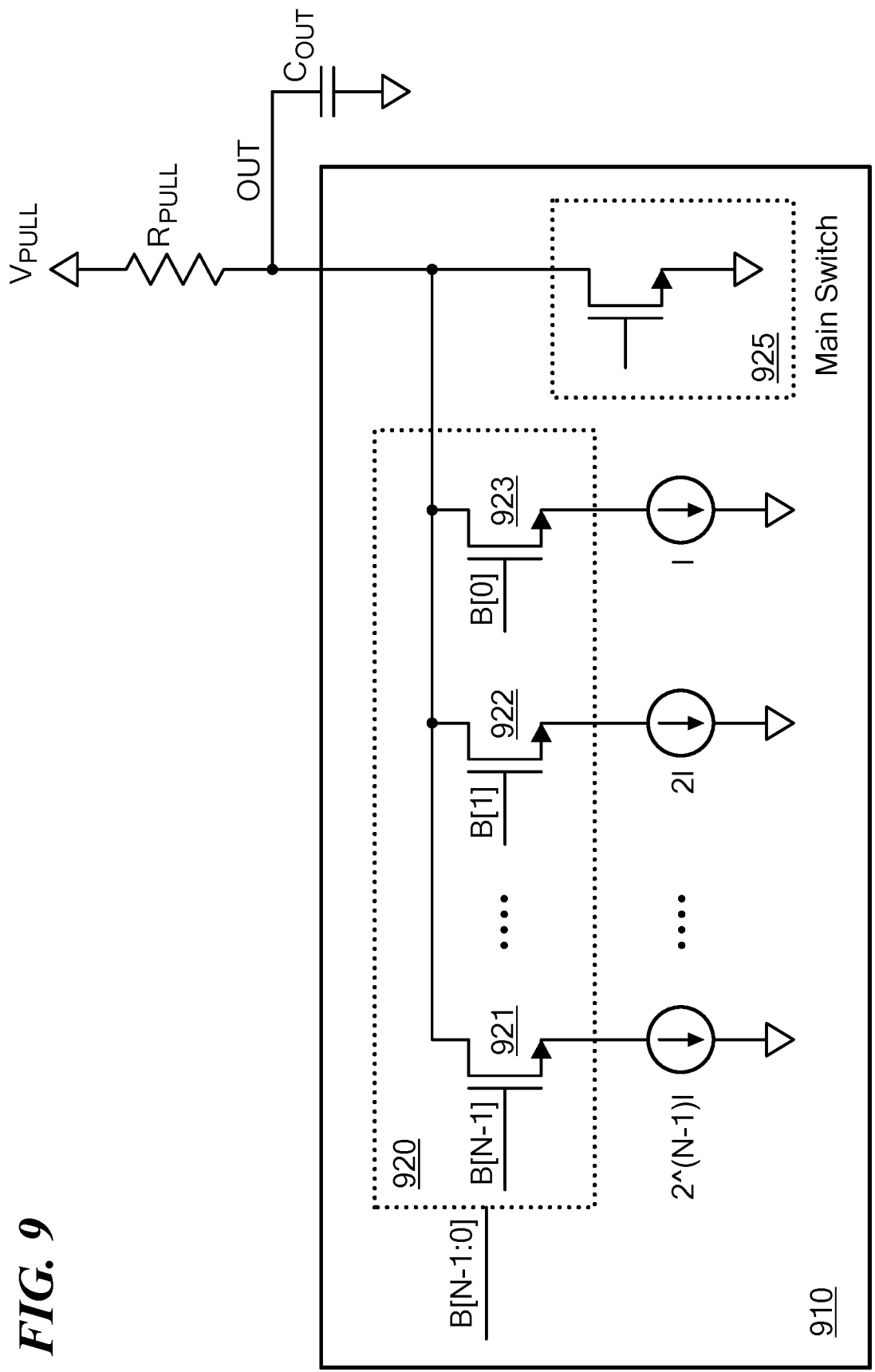
FIG. 9 is a block diagram showing an example configuration of a circuit for generating a sensor output signal having switching elements and a current source to generate two different percentage voltages with a configuration having multiple selectable parallel paths, according to an embodiment of the present disclosure.

FIG. 8 is a block diagram showing an example configuration of a circuit for generating a sensor output signal having switching elements and a current source to generate two different percentage voltages with a configuration having multiple selectable parallel paths, according to an embodiment of the present disclosure. FIG. 8 is similar to the embodiment of FIG. 6, with current sources used instead of resistors for the network coupled to the switches.

The output circuit 810 includes at least two switching elements 820 including a first switching element 821 and a second switching element 822 that are each, respectively, coupled to a low current source ILOW or high current source IHIGH to generate the two respective output voltages as respective percentages of the supply voltage. The first switching element 821 is configured to be active to couple a first network (e.g., the ILOW current source) to the output to provide the output signal at a first percentage voltage when the input signal is a logic low level or to be inactive to decouple the first network from the output when the input signal is at a logic high level. The second switching element 622 is configured to be active to couple a second network (e.g, the IHIGH current source) to the output to provide the output signal at a second percentage voltage that is different than the first percentage voltage when the input signal is at the logic high level or to be inactive to decouple the second network from the output when the input signal is at the logic low level. In the embodiment shown in FIG. 8, the first network comprises a first current source having a first current and the second network comprises a second current source having a second current different than the first current. Also shown in FIG. 8 are components external to the sensor including pull-up resistor RPULL and filter capacitor COUT.

The circuit 810 includes a third switching element 825 that is coupled in parallel with the first switching element 821 and the second switching 822 element and configured to be active when neither the first switching element nor the second switching element is active. Accordingly, both of the switching elements 821 and 822 can be turned off and by operation of switch 825 the sensor output can be provided as a conventional open-drain output. One of the three switching elements 821, 822, and 825 are configured to be active at a time, each one corresponding to, for example, a different line of the Table 1 shown hereinabove. Each of the first, second, and third switching elements can comprise a transistor or other appropriate switching element.

In this embodiment, for the output, the switch 825 can be off and the output current can be set to IHIGH, ILOW, or OFF (no current) to have the high state, low state, and safe state, respectively. Again, the limitation with this topology is that RPULL must be known to have an accurate output voltage. The first current source is configured to source or sink a first current and the second current source is configured to source or sink a second current, where a level of the first current is different than a level of the second current.

The circuit 810 of FIG. 8 can be modified to add trimming to give more flexibility to choose RPULL, as shown in FIG. 9. FIG. 9 is a block diagram showing an example configuration of a circuit for generating a sensor output signal having switching elements and a current source to generate two different output voltages as respective percentages of the supply voltage with a configuration having multiple selectable parallel paths, according to an embodiment of the present disclosure. The output circuit 910 includes an array of switching elements 920, including at least three switching elements 921, 922, and 923, that are each, respectively, coupled to a scaled current source $2^{(N-1)}I$, 2I, and I as respective percentages of the supply voltage to generate at least two respective reference voltages. By providing an input select signal B[N-1:0], each of the switches 921, 922, 923, can be selectively turned off or on to provide the desired output voltage at a level established by RPULL and the selected one or ones of current sources $2^{(N-1)}I$, 2I, and I. With this configuration, the first and second percentages of the supply voltage presented at the sensor output can be adjusted, or trimmed, based on the value of RPULL and the desired first and second percentages. The input select signals or bits B[N-1:0] can be stored, for example, in an EEPROM, in the form of different codes to generate the high and low outputs at the desired percentages. Also shown in FIG. 9 are components external to the sensor including pull-up resistor RPULL and filter capacitor COUT.

The circuit 910 includes an additional switching element 925 that is coupled in parallel with the array of switching elements 920 and is configured to be active when none of the switches 921, 922, or 923 in the array of switching elements 920 are active. Accordingly, all of the switching elements in the switching array 920 can be turned off and by operation of switch 925, the sensor output can be provided as a conventional open-drain output. Each of the switching elements can comprise a transistor or other appropriate switching element.

Figure 10:
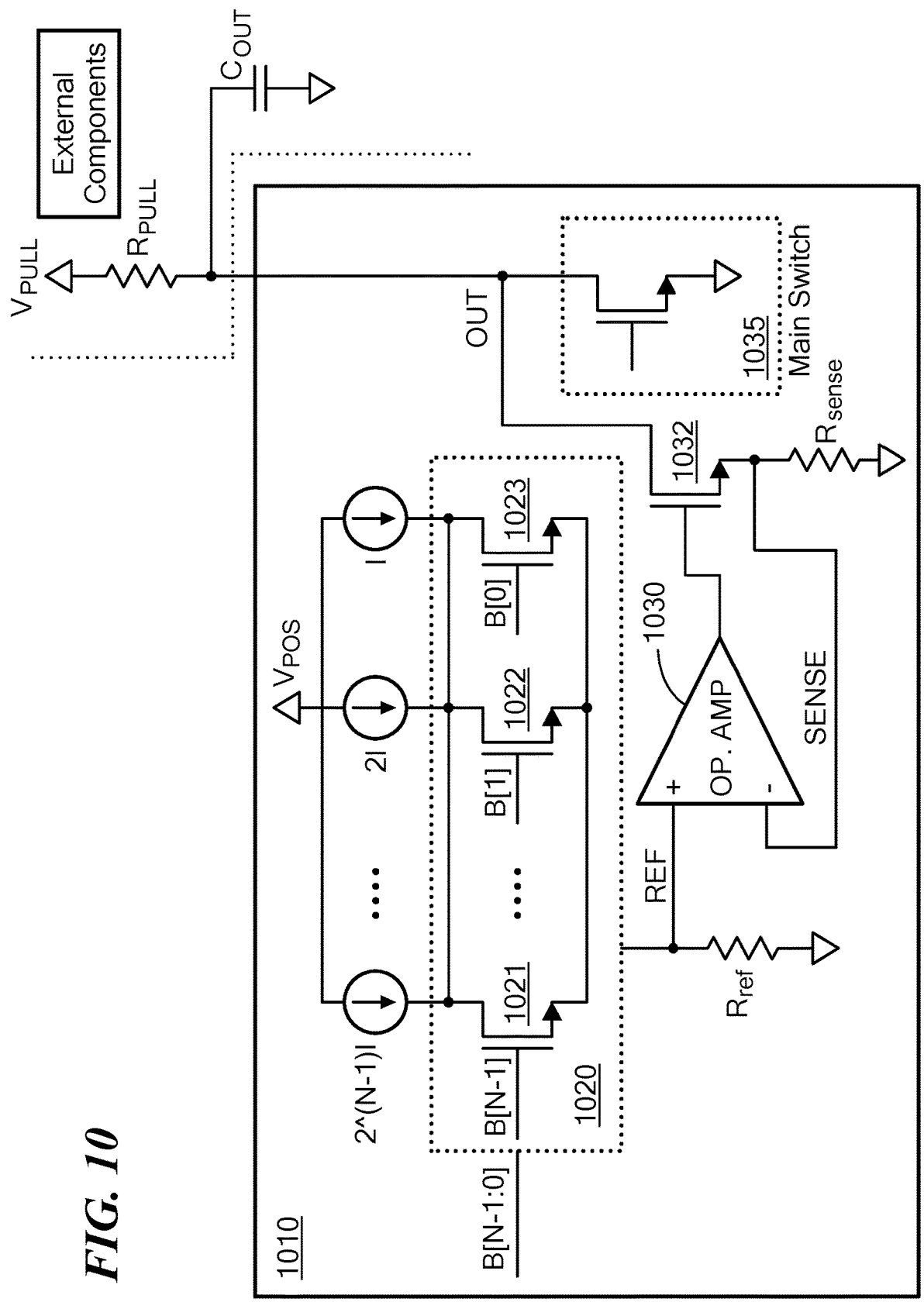
FIG. 10 is a block diagram showing an example configuration of a circuit for generating a sensor output signal having switching elements and a current source to generate two different percentage voltages with a configuration having multiple selectable parallel paths, according to an embodiment of the present disclosure.

The circuit presented in FIG. 9 permits output level trimming to accommodate different RPULL values by selection of scaled current sources. FIG. 10 is a block diagram showing an example configuration using a similar concept of trimming with scaled current sources, but in a manner that permits smaller current sources (on the order of microamps rather than milliamps) to be used. Current sources $2^{(N-1)}I$ . . . 2I, I, can be smaller current sources as compared to the current sources of FIG. 9 because the operational amplifier 1030 is coupled to amplify the current by the one or more current sources coupled to the REF input by control of the switching array 1020. The output circuit 1010 includes an array of switching elements 1020 including at least three switching elements 1021, 1022, and 1023, that are each, respectively, coupled to a scaled current source $2^{(N-1)}I$, 2I, and I, to generate the two respective reference current sources as respective percentages of the supply voltage. By providing an input select signal B[N-1:0], each of the switches 1021, 1022, 1023, can be selectively turned off or on to provide the desired output voltage at a level established by RPULL and the selected one or ones of current sources $2^{(N-1)}I$, 2I, and I. With this configuration, the first and second percentages of the supply voltage presented at the sensor output can be adjusted, or trimmed, based on the value of RPULL and the desired first and second percentages. The input select signals or bits B[N-1:0] can be stored, for example, in an EEPROM in the form of different codes to generate the high and low outputs at the desired percentages. The output current is amplified by the ratio Rref/Rsense. For example, if the Rref value is 10% of Rsense, then Rsense will amplify the output ten times. Also shown in FIG. 7 are components external to the sensor including pull-up resistor RPULL and filter capacitor COUT.

The circuit 1010 includes an additional switching element 1035 that is coupled in parallel with the array of switching elements 1020 and is configured to be active when none of the switches 1021, 1022, or 1023 in the array of switching elements 1020 are active. Accordingly, all of the switching elements in the switching array 1020 can be turned off and by operation of switch 1035, the sensor output can be provided as a conventional open-drain output. Each of the switching elements can comprise a transistor or other appropriate switching element.

Figure 11:
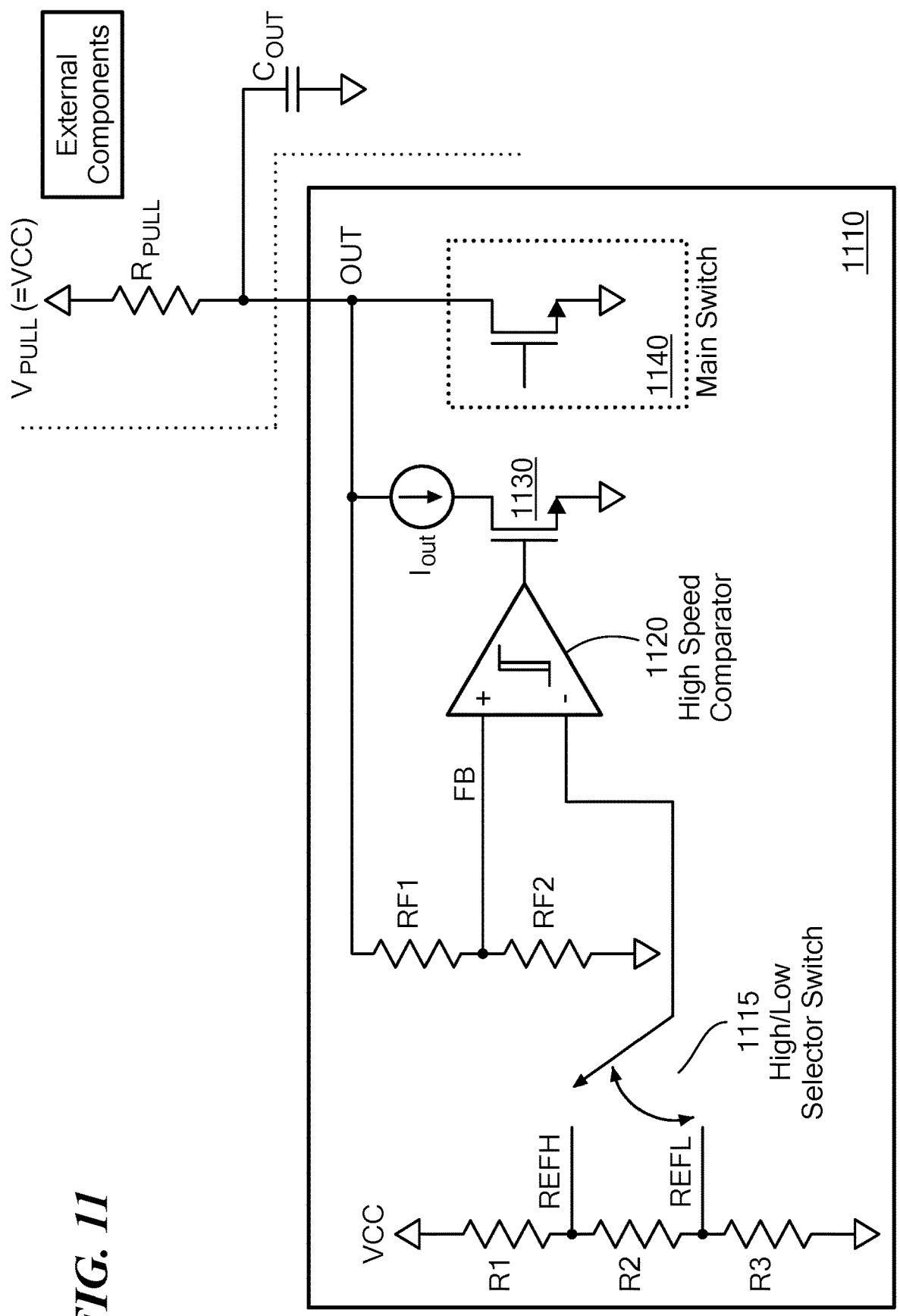
FIG. 11 is a block diagram showing an example configuration of a circuit for generating a sensor output signal in a closed-loop feedback configuration and including a hysteresis comparator, according to an embodiment of the present disclosure.

FIG. 11 is a block diagram showing an example configuration of a circuit for generating a sensor output signal in a closed-loop feedback configuration and including a hysteretic comparator, according to an embodiment of the present disclosure. The circuit 1110 has a closed-loop configuration and includes a resistor divider comprising resistors RF1 and RF2 that sense the output voltage on the OUT pin. The output is fed back into one input of the comparator 1120 to provide a feedback signal FB. The feedback signal FB is compared to a reference voltage (fed into the other input of the comparator 1120) that is taken from VCC, in which two possible references can be selected. The hysteresis comparator must be a high speed comparator that is very fast to provide the output as a percentage rather than an absolute value. As such, there is no COUT required with this configuration. Also shown in FIG. 11 are components external to the circuit, including pull-up resistor RPULL and filter capacitor COUT.

The reference voltage is generated by a resistor divider (including resistors R1, R2, and R3) coupled to a supply voltage VCC and selectively coupled to the comparator 1120 by a switch 1115. A first reference voltage REFH is selected by the switch 1115 to set the high state, which can be X % of the supply voltage (VCC) and a second reference voltage REFL is selected by the switch 1115 to set the low state, which can be Y % of the supply voltage (VCC) as shown in Table 1 hereinabove. The switch 1115 is controlled by the output of the Schmitt trigger (e.g., Schmitt trigger 124 in FIG. 1). When the output of the Schmitt trigger (i.e., the input signal to the output control block 134) is a logic high, the switch selects the high reference voltage REFH, and when the input signal is a logic low, the switch selects the low reference voltage REFL.

The comparison of the feedback signal (FB) to the high reference voltage REFH or the low reference voltage REFL is performed by the comparator 1120. The comparator output signal controls the gate of the pass element 1130 (e.g., NMOS transistor) to output the selected percentage of the supply voltage. The high speed comparator 1120 is used to turn ON/OFF an Iout current depending on whether the feedback voltage is above or below the reference established by switch 1115. When Iout is connected (via pass element 1130), the output voltage will be discharged until it goes below the reference (REFH or REFL) minus the internal hysteresis of the high speed comparator. Iout will be disconnected at that point and the output voltage will increase given that COUT is recharged by the pull-up resistor (RPULL). When the output voltage reaches the reference voltage, Iout will be re-connected and the cycle restarts. A minimum output capacitor may be needed given that the speed of the comparator is limited and it needs to react as fast as possible when the output voltage is below the reference. For safe state, Iout is disconnected and the output voltage will go to VPULL. For a standard open-drain output, Iout will be disconnected and a switch 1140 will be set on or off according to the state of the part.

FIG. 12 is a block diagram showing an example configuration of a circuit for generating a sensor output signal for a linear output in a closed-loop feedback configuration, according to an embodiment of the present disclosure. It will be appreciated that the ratiometric configurations of the present disclosure can be applicable to other sensor types, such as a linear output from an amplifier 1212 as shown in FIG. 12. The linear signal path from amplifier 1212 can be used as a reference for the operational amplifier 1214 to control the sensor output and allow for a safe state to be conveyed.

FIG. 12 shows an example sensor output circuit 1210 which, for example, can reside within the output control block 134 shown in FIG. 1. Also shown in FIG. 12 are components external to the sensor including pull-up resistor RPULL and filter capacitor COUT. The circuit 1210 has a closed-loop configuration and includes a resistor divider comprising resistors RF1 and RF2 that sense the output voltage on the OUT pin. The output is fed back into one input of the operational amplifier 1214 to provide a feedback signal FB. The feedback signal FB is compared to the output of the amplifier 1212, as sensed by a second resistor divider comprising resistors RF1 and RF2 that sense the output of the amplifier 1212. The amplifier may be, for example, amplifier 114 shown in FIG. 1.

The comparison of the feedback signal FB to the output of the amplifier 1212 is performed by the operational amplifier 1214. The resulting difference signal generated by the operational amplifier 1214 controls the gate of the pass element 1215 (e.g., NMOS transistor) to output the linear output of amplifier 1212 in the form of a linear signal presented as a linear percentage of the supply voltage.

In order to stabilize the feedback system, compensation components as may include a compensation resistor (RC) and a compensation capacitor (CC) can be provided. These compensation components add a pole at the 0 Hz (integrator) and a zero at $1/(2\pi*RC*CC)$. The compensation components have high open-loop gain at low frequencies to reduce the regulation error, and at high frequencies the open-loop gain drops until the zero comes in, leaving the output pole to continue the gain dropping until the 0 dB line is crossed. If the output pole is equal to or greater than zero, the phase margin is sufficient to have the systems table. If no external capacitor is used, the pole at the NMOS gate limits the bandwidth before another internal pole comes in. As such, there is no requirement for an external capacitor (COUT) that is typically required with an open-loop single path configuration. By stabilizing internally, the external capacitor COUT is not needed. The configuration also allows for a conventional open-drain output to be realized by turning off the operational amplifier 1214, thereby allowing both types of outputs on a single die.

FIG. 13 is a flow chart illustrating an example process for generating an output signal at an output of a circuit that receives an input signal having a logic high level or a logic low level, applicable to both closed-loop feedback configurations and multiple selectable parallel paths configurations, according to the present disclosure. At block 1310, a supply voltage is received. This supply voltage can, for example, be VPULL shown in any of the FIGS, which may or may not be the same as VCC (but which must be the same as VCC in the feedback configurations such as FIGS. 4, 5, 11, and 12).

At block 1320, the output signal (e.g., the output of the output control 134 shown in FIG. 1) is output at a first level corresponding to a first percentage of the supply voltage when the input signal (e.g., the output of the Schmitt trigger 124 shown in FIG. 1 and/or the input to the output control circuit 134 shown in FIG. 1) is at a logic low level. In feedback configurations, the output signal can be provided at the first level by operation of a switch (e.g., switch 415 of FIG. 4) to select a low reference voltage (e.g., REFL) for example. In selectable parallel path configurations, the output signal can be provided at the first level by turning on a first switch (e.g., switch 621 of FIG. 6) coupled to the circuit output through a first network (e.g., pull-down resistor RLOW) for example. The first network can be a first resistor having a first resistance or a first current source configured to source or sink a first current.

At block 1330, the output signal (e.g., the output of the output control 134 shown in FIG. 1) is output at a second level corresponding to a second percentage of the supply voltage when the input signal (e.g., the output of the Schmitt trigger 124 shown in FIG. 1 and/or the input to the output control circuit 134 shown in FIG. 1) is at a logic low level. In feedback configurations, the output signal can be provided at the second level by operation of a switch (e.g. switch 415 of FIG. 4) to select a high reference voltage (e.g., REFH) for example. In selectable parallel path configurations, the output signal can be provided at the second level by turning on a second switch (e.g., switch 622 of FIG. 6) coupled to the circuit output through a second network (e.g., pull-down resistor RHIGH) for example. The second network can be a second resistor having a second resistance difference than the first resistance or a second current source configured to sink or course a second current, wherein a level of the first current is different than a level of the second current.

At block 1340, the output signal (e.g., the output of the output control 134 shown in FIG. 1) is output at a third level different than the first level and the second level when the input signal (e.g., the output of the Schmitt trigger 124 shown in FIG. 1, and/or the input to the output control circuit 134 shown in FIG. 1, and/or the system diagnostics 132 in FIG. 1, and/or a component within the output control signal 134 shown in FIG. 1) indicates a fault. Because the logic high and logic low sensor output levels are provided at respective percentages of the supply voltage, the supply voltage level and/or ground can be used to convey the fault.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit to generate an output signal at an output coupled to a supply voltage through a pull-up resistor, the output signal generated in response to an input signal having a logic high level or a logic low level, the circuit comprising:
    a resistor divider coupled to the supply voltage and configured to produce a first reference voltage that is a first percentage of the supply voltage or a second reference voltage that is a second percentage of the supply voltage not equal to the first percentage of the supply voltage;
    an operational amplifier having a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided; and
    a pass element having a first terminal at which the output signal is provided, a second terminal, and a third, control terminal responsive to the difference signal to generate the output signal at a level corresponding to the first reference voltage or the second reference voltage.

2. The circuit of claim 1, further comprising a switch coupled between the second input of the operational amplifier and the resistor divider, the switch configured to couple a first reference resistor of the resistor divider to the second input of the operational amplifier when the input signal is at the logic high level and to couple a second reference resistor of the resistor divider to the second input of the operational amplifier when the input signal is at the logic low level.

3. The circuit of claim 1, wherein a fault is indicated when the output signal is at a level corresponding to the supply voltage or ground.

4. The circuit of claim 1, wherein the pass element comprises an NMOS (n-channel metal-oxide-semiconductor) field-effect transistor.

5. The circuit of claim 1, further comprising a chopper circuit coupled to the operational amplifier to remove offset associated with the operational amplifier.

6. The circuit of claim 1, wherein the input signal is provided by a Schmitt trigger circuit.

7. The circuit of claim 6, wherein the circuit forms part of a magnetic field sensor and wherein the Schmitt trigger circuit generates the input signal by comparing a magnetic field signal to a threshold.

8. The circuit of claim 1, wherein the circuit forms part of a magnetic field sensor and wherein the input signal is provided by a linear signal path that generates a magnetic field signal indicative of a magnetic field strength.

9. The circuit of claim 1, further comprising a compensation resistor and a compensation capacitor coupled between the output of the operational amplifier and the second input of the operational amplifier.

10. The circuit of claim 1, wherein the circuit comprises an integrated circuit and wherein the output signal is provided at an output terminal of the integrated circuit.

11. The circuit of claim 1, wherein the first percentage of the supply voltage is neither zero percent nor one-hundred percent and wherein the second percentage of the supply voltage is neither zero percent nor one-hundred percent.

12. The circuit of claim 1, further comprising a switching element coupled in parallel with the pass element and configured to be active when the pass element is not active.

13. A method of generating an output signal at an output of a circuit that receives an input signal having a logic high level or a logic low level, the method comprising:
    receiving a supply voltage;
    providing the output signal at a first level corresponding to a first percentage of the supply voltage when the input signal is a logic low level by generating a first difference signal by comparing a feedback version of the output signal to a first reference voltage corresponding to the first percentage and controlling a pass element based on the first difference signal;
    providing the output signal at a second level corresponding to a second percentage of the supply voltage when the input signal is a logic high level by generating a second difference signal by comparing the feedback version of the output signal to a second reference voltage corresponding to the second percentage and controlling the pass element based on the second difference signal; and
    providing the output signal at a third level that is different than the first level and the second level when a fault is detected, wherein the third level corresponds to the supply voltage or ground.

14. The method of claim 13 wherein the input signal is provided by a Schmitt trigger circuit.

15. The method of claim 14, wherein the circuit forms part of a magnetic field sensor and wherein the Schmitt trigger circuit generates the input signal by comparing a magnetic field signal to a threshold.

16. The method of claim 13, wherein the first percentage of the supply voltage level is neither zero percent nor one-hundred percent and wherein the second percentage of the supply voltage level is neither zero percent nor one-hundred percent.

17. A circuit to generate an output signal in response to an input signal having a logic high level or a logic low level, the circuit comprising:
- a resistor divider coupled to a supply voltage and configured to produce a first reference voltage that is a first percentage of the supply voltage or a second reference voltage that is a second percentage of the supply voltage not equal to the first percentage of the supply voltage;
- an operational amplifier having a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided; and
- means responsive to the difference signal to generate the output signal at a level corresponding to the first reference voltage or the second reference voltage, wherein the input signal is provided by a Schmitt trigger circuit and the circuit forms part of a magnetic field sensor and wherein the Schmitt trigger circuit generates the input signal by comparing a magnetic field signal to a threshold.

18. The circuit of claim 17, further comprising means for indicating a fault when the output signal is at a level corresponding to the supply voltage or ground.

19. A circuit to generate an output signal in response to an input signal having a logic high level or a logic low level, the circuit comprising:
- a resistor divider coupled to a supply voltage and configured to produce a first reference voltage that is a first percentage of the supply voltage or a second reference voltage that is a second percentage of the supply voltage not equal to the first percentage of the supply voltage;
- an operational amplifier having a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided; and
- a pass element having a first terminal at which the output signal is provided, a second terminal, and a third, control terminal responsive to the difference signal to generate the output signal at a level corresponding to the first reference voltage or the second reference voltage, wherein the input signal is provided by a Schmitt trigger circuit and wherein the circuit forms part of a magnetic field sensor and wherein the Schmitt trigger circuit generates the input signal by comparing a magnetic field signal to a threshold.

20. A circuit to generate an output signal in response to an input signal having a logic high level or a logic low level, the circuit comprising:
- a resistor divider coupled to a supply voltage and configured to produce a first reference voltage that is a first percentage of the supply voltage or a second reference voltage that is a second percentage of the supply voltage not equal to the first percentage of the supply voltage;
- an operational amplifier having a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided; and
- a pass element having a first terminal at which the output signal is provided, a second terminal, and a third, control terminal responsive to the difference signal to generate the output signal at a level corresponding to the first reference voltage or the second reference voltage, wherein the circuit forms part of a magnetic field sensor and wherein the input signal is provided by a linear signal path that generates a magnetic field signal indicative of a magnetic field strength.

21. A circuit to generate an output signal in response to an input signal having a logic high level or a logic low level, the circuit comprising:
- a resistor divider coupled to a supply voltage and configured to produce a first reference voltage that is a first percentage of the supply voltage or a second reference voltage that is a second percentage of the supply voltage not equal to the first percentage of the supply voltage;
- an operational amplifier having a first, feedback input coupled to receive the output signal, a second input selectively coupled to receive the first reference voltage when the input signal is at a logic high level or the second reference voltage when the input signal is at a logic low level, and an output at which a difference signal indicative of a difference between the output signal and the first reference voltage or the second reference voltage is provided;
- a pass element having a first terminal at which the output signal is provided, a second terminal, and a third, control terminal responsive to the difference signal to generate the output signal at a level corresponding to the first reference voltage or the second reference voltage; and
- a switching element coupled in parallel with the pass element and configured to be active when the pass element is not active.

* * * * *

UNITED STATES PATENT AND TRADEMARK OFFICE
CERTIFICATE OF CORRECTION

PATENT NO. : 10,908,230 B2
APPLICATION NO. : 16/901103
DATED : February 2, 2021
INVENTOR(S) : Ezequiel Rubinsztain et al.

It is certified that error appears in the above-identified patent and that said Letters Patent is hereby corrected as shown below:

In the Specification

Column 1, Line 28 delete "or magnetic" and replace with --or more magnetic--.

Column 2, Line 63 delete "when the neither" and replace with --when neither--.

Column 10, Line 40 delete "amplifier 320." and replace with --amplifier 420.--.

Column 13, Line 21 delete "switching 822 element" and replace with --switching element 822--.

Column 13, Line 33 delete "THIGH," and replace with --IHIGH,--.

Column 14, Line 41 delete "FIG. 7" and replace with --FIG. 10--.

Column 17, Line 3 delete "difference" and replace with --different--.

Signed and Sealed this
Thirteenth Day of June, 2023

Katherine Kelly Vidal
*Director of the United States Patent and Trademark Office*